US009412698B2

(12) United States Patent
Watanabe

(10) Patent No.: US 9,412,698 B2
(45) Date of Patent: *Aug. 9, 2016

(54) SEMICONDUCTOR DEVICE HAVING GROOVE-SHAPED VIA-HOLE

(71) Applicant: FUJITSU SEMICONDUCTOR LIMITED, Yokohama-shi, Kanagawa (JP)

(72) Inventor: Kenichi Watanabe, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/310,244

(22) Filed: Jun. 20, 2014

(65) Prior Publication Data

US 2014/0299960 A1    Oct. 9, 2014

Related U.S. Application Data

(62) Division of application No. 13/548,857, filed on Jul. 13, 2012, now Pat. No. 8,872,347, which is a division (Continued)

(30) Foreign Application Priority Data

Jul. 31, 2002    (JP) .................. 2002-223343

(51) Int. Cl.
  *H01L 23/58*    (2006.01)
  *H01L 23/48*    (2006.01)
  (Continued)

(52) U.S. Cl.
  CPC ........ *H01L 23/53228* (2013.01); *H01L 23/481* (2013.01); *H01L 23/485* (2013.01);
  (Continued)

(58) Field of Classification Search
  CPC ............. H01L 23/522; H01L 29/0619; H01L 23/5329; H01L 23/585; H01L 23/485; H01L 23/58; H01L 29/0611; H01L 23/528; H01L 29/0607; H01L 23/481; H01L 23/562; H01L 23/5226; H01L 23/53228; H01L 23/53204; H01L 23/5227; H01L 23/53295; H01L 2924/0002; H01L 2924/00; H01L 23/48

USPC .................... 257/775, 758, E23.18, E23.145, 257/E23.167, E23.142, 773, 776, 700, 701, 257/753, 491
  IPC .......... H01L 23/522,29/0619, 23/5329, 23/585, H01L 23/58, 29/0611, 23/528, 29/0607, 23/481, H01L 23/562, 23/5226, 23/53228, 23/53204, H01L 23/5227, 23/53295, 2924/0002, 2924/00, H01L 23/48
  See application file for complete search history.

(56) References Cited

U.S. PATENT DOCUMENTS 5,418,329 A    5/1995    Katoh et al.
5,891,808 A    4/1999    Chang et al.
(Continued)

FOREIGN PATENT DOCUMENTS

JP    60-20578 A    2/1985
JP    62-23135 A    1/1987
(Continued)

OTHER PUBLICATIONS

Wada et al., "Low Resistance Dual Damascene Process by New Al Reflow using Nb Liner", 1998 Symposium on VLSI Technology Digest of Technical Papers, pp. 48-49 (Cited in European Search Report dated Mar. 15, 2012).

(Continued)

*Primary Examiner* — Alexander Oscar Williams
(74) *Attorney, Agent, or Firm* — Westerman, Hattori, Daniels & Adrian, LLP

(57) ABSTRACT

The semiconductor device has insulating films 40, 42 formed over a substrate 10; an interconnection 58 buried in at least a surface side of the insulating films 40, 42; insulating films 60, 62 formed on the insulating film 42 and including a hole-shaped via-hole 60 and a groove-shaped via-hole 66a having a pattern bent at a right angle; and buried conductors 70, 72a buried in the hole-shaped via-hole 60 and the groove-shaped via-hole 66a. A groove-shaped via-hole 66a is formed to have a width which is smaller than a width of the hole-shaped via-hole 66. Defective filling of the buried conductor and the cracking of the inter-layer insulating film can be prevented. Steps on the conductor plug can be reduced. Accordingly, defective contact with the upper interconnection layer and the problems taking place in forming films can be prevented.

15 Claims, 38 Drawing Sheets

Related U.S. Application Data of application No. 13/013,103, filed on Jan. 25, 2011, now Pat. No. 8,410,613, which is a division of application No. 11/898,548, filed on Sep. 13, 2007, now Pat. No. 7,906,851, which is a division of application No. 10/622,614, filed on Jul. 21, 2003, now Pat. No. 7,301,241.

(51) Int. Cl.
| | |
|---|---|
| *H01L 23/532* | (2006.01) |
| *H01L 23/522* | (2006.01) |
| *H01L 29/06* | (2006.01) |
| *H01L 23/528* | (2006.01) |
| *H01L 23/485* | (2006.01) |
| *H01L 23/00* | (2006.01) |

(52) U.S. Cl.
CPC ............ *H01L23/522* (2013.01); *H01L 23/528* (2013.01); *H01L 23/5226* (2013.01); *H01L 23/5329* (2013.01); *H01L 23/53204* (2013.01); *H01L 23/562* (2013.01); *H01L 23/58* (2013.01); *H01L 23/585* (2013.01); *H01L 29/0607* (2013.01); *H01L 29/0611* (2013.01); *H01L 29/0619* (2013.01); *H01L 23/5227* (2013.01); *H01L 23/53295* (2013.01); *H01L 2924/0002* (2013.01)

(56) References Cited

U.S. PATENT DOCUMENTS

| | | | |
|---|---|---|---|
| 6,163,067 | A | 12/2000 | Inohara et al. |
| 6,204,557 | B1 | 3/2001 | Lien et al. |
| 6,218,925 | B1 | 4/2001 | Iwao |
| 6,362,524 | B1 | 3/2002 | Blish et al. |
| 6,483,714 | B1 | 11/2002 | Kabumoto et al. |
| 6,639,278 | B2 | 10/2003 | Sumida et al. |
| 6,713,886 | B2 | 3/2004 | Kumagai et al. |
| 6,956,248 | B2 | 10/2005 | Casey et al. |
| 6,963,139 | B2 | 11/2005 | Kishida et al. |
| 7,045,834 | B2 | 5/2006 | Tran et al. |
| 7,301,241 | B2 | 11/2007 | Watanabe |
| 7,446,418 | B2 | 11/2008 | Watanabe |
| 7,485,912 | B2 | 2/2009 | Wang |
| 7,906,851 | B2 | 3/2011 | Watanabe |
| 8,410,613 | B2 | 4/2013 | Watanabe |
| 8,791,576 | B2 | 7/2014 | Watanabe |
| 8,841,775 | B2 | 9/2014 | Watanabe |
| 8,853,861 | B2 | 10/2014 | Watanabe |
| 8,872,352 | B2 | 10/2014 | Watanabe |
| 8,872,353 | B2 | 10/2014 | Watanabe |
| 2002/0000665 | A1 | 1/2002 | Barr et al. |
| 2002/0024115 | A1 | 2/2002 | Ibnabdeljalil et al. |
| 2002/0096715 | A1 | 7/2002 | Sumida et al. |
| 2002/0134991 | A1 | 9/2002 | Casey et al. |
| 2006/0038292 | A1 | 2/2006 | Minami et al. |
| 2006/0163720 | A1* | 7/2006 | Hirata .......................... 257/704 |
| 2007/0090447 | A1* | 4/2007 | Morimoto et al. ............ 257/316 |
| 2012/0273956 | A1 | 11/2012 | Watanabe |
| 2012/0280396 | A1 | 11/2012 | Watanabe |
| 2012/0319281 | A1 | 12/2012 | Watanabe |
| 2013/0168799 | A1 | 7/2013 | Watanabe |
| 2013/0175691 | A1 | 7/2013 | Watanabe |
| 2013/0175692 | A1 | 7/2013 | Watanabe |
| 2013/0200481 | A1 | 8/2013 | Watanabe |
| 2014/0327143 | A1* | 11/2014 | Watanabe ..................... 257/762 |

FOREIGN PATENT DOCUMENTS

| | | |
|---|---|---|
| JP | 3-89548 A | 4/1991 |
| JP | 5-74952 A | 3/1993 |
| JP | 5-175198 A | 7/1993 |
| JP | 7-201855 A | 8/1995 |
| JP | 11-54705 A | 2/1999 |
| JP | 2000-124403 A | 4/2000 |
| JP | 2000-269219 A | 9/2000 |
| JP | 2000-294625 A | 10/2000 |
| JP | 2001-351920 A | 12/2001 |
| JP | 2003-86590 A | 3/2003 |
| KR | 10-1998-082595 A | 12/1998 |

OTHER PUBLICATIONS

European Search Report dated Mar. 15, 2012, issued in corresponding European Patent Application No. 10000804.4.
European Search Report dated Dec. 28, 2004, issued in corresponding European Patent Application No. 03016553.4.
Japanese Office Action dated Oct. 25, 2005, issued in corresponding Japanese Patent Application No. 2002-223343.
European Search Report dated Feb. 24, 2012, issued in corresponding European Patent Application No. 10000803.6.
US Office Action dated Aug. 17, 2012, issued in correspondence to U.S. Appl. No. 13/013,103.
Non-Final Office Action dated Jul. 6, 2015, issued in U.S. Appl No. 14/313,024 (17 pages).
Non-Final Office Action dated Jul. 6, 2015, issued in U.S. Appl. No. 14/313,010 (17 pages).
Non-Final Office Action dated Jul. 6, 2015, issued in U.S. Appl. No. 14/312,867 (17 pages).
Non-Final Office Action dated Jul. 6, 2015, issued in U.S. Appl. No. 14/304,088 (19 pages).
Non-Final Office Action dated Jul. 6, 2015, issued in U.S. Appl. No. 14/304,139 (19 pages).
Non-Final Office Action dated Jul. 6, 2015, issued in U.S. Appl. No. 14/304,186 (19 pages).
Non-Final Office Action dated Jul. 6, 2015, issued in U.S. Appl. No. 14/304,225 (19 pages).
Extended European Search Report dated Jun. 18, 2015, issued in counterpart European Patent Application No. 15150443.8 (7 pages).
Extended European Search Report dated Jun. 23, 2015, issued in counterpart European Patent Application No. 15150440.4 (7 pages).
Non-Final Office Action dated Feb. 3, 2016, issued in U.S. Appl. No. 14/310,612. (7 pages).
European Office Action dated Apr. 19, 2016, issued in counterpart European application No. 15150443.8 (7 pages).
European Office Action dated Apr. 21, 2016, issued in counterpart European application No. 15150440.4 (6 pages).

\* cited by examiner

DEFECTIVE FILLING

CRACK

CRACK

SEMICONDUCTOR DEVICE HAVING GROOVE-SHAPED VIA-HOLE

CROSS-REFERENCE TO RELATED APPLICATIONS

This application is a divisional application of U.S. patent application Ser. No. 13/548,857 filed on Jul. 13, 2012,now U.S. Pat. No. 8,872,347, which is a divisional application of U.S. patent application Ser. No. 13/013,103 filed on Jan. 25, 2011, now U.S. Pat. No. 8,410,613, which is a divisional of U.S. patent application Ser. No. 11/898,548 filed on Sep. 13, 2007, now U.S. Pat. No. 7,906,851, which is a divisional of U.S. patent application Ser. No. 10/622,614, filed on Jul. 21, 2003, now U.S. Pat. No. 7,301,241, which is based upon and claims the benefit of priority from the prior Japanese Patent Application No. 2002-223343, filed in Jul. 31, 2002, the entire contents of which are incorporated herein by reference.

BACKGROUND OF THE INVENTION

The present invention relates to a semiconductor device, more specifically a semiconductor device having a conductor buried in a hole-shaped pattern or a groove-shaped pattern formed in an insulating film, and a method for fabricating the semiconductor device.

As semiconductor devices are larger-scaled and higher integrated, the design rules of interconnections are more shrunk with generations. Conventionally, interconnection layer has been formed by depositing and patterning the interconnection material by lithography and dry etching. However, this has found technological limitation as the generations advance. As a new process for forming interconnection layer, which takes the place of the conventional interconnection layer forming process, the so-called damascene process, i.e., forming a groove-shaped pattern or a hole-shaped pattern in inter-layer insulating film and then burying interconnection material in the groove or the hole is being used. The damascene process can easily form interconnection layer of low resistance materials, such as copper, etc., which are difficult for reactive etching, and is very effective to form interconnection layer of low resistance having micronized pattern.

The damascene process is used not only in forming the usual interconnection layers, but also in forming various structures. For example, the Laid-open Japanese Patent Application No. 2000-124403 discloses an inductor and the method for fabricating the same fabricated by the damascene process.

Then, a conventional semiconductor device fabricated by the damascene process will be explained by means of a semiconductor device including an inductor. FIGS. 35A and 35B are plan views of the conventional semiconductor device. FIG. 36 is a diagrammatic view of the conventional semiconductor device, which shows the structure thereof. FIG. 36 is the sectional view along the line A-A' in FIG. 35B.

An etching stopper film 302 and an inter-layer insulating film 304 are formed on a substrate 300. Interconnection groove 308 is formed in the inter-layer insulating film 304 and the etching stopper film 302. An interconnection 314 having a diffusion preventing film 310 and a copper film 312 is formed in the interconnection groove 308.

An etching stopper film 316 and an inter-layer insulating film 318 are formed on the inter-layer insulating film 304 with the interconnection 314 buried in. Groove-shaped via-holes 326 are formed in the inter-layer insulating film 318 and the etching stopper film 316 down to the interconnection 314. An etching stopper film 320 and an inter-layer insulating film 322 are formed on the inter-layer insulating film 318. Interconnection groove 332 is formed in the inter-layer insulating film 322 and the etching stopper film 320. An interconnection 338 having a diffusion preventing film 334 and a copper film 336 and connected to the interconnection 314 is formed in the via-holes 326 and the interconnection groove 332.

An etching stopper film 340 and an inter-layer insulating film 342 are formed on the inter-layer insulating film 322 with the interconnection 338 buried in. Groove-shaped via-holes 348 are formed in the inter-layer insulating film 342 and the etching stopper film 340 down to the interconnection 338. An etching stopper film 344 and an inter-layer insulating film 346 are formed on the inter-layer insulating film 342. Interconnection groove 350 is formed in the inter-layer insulating film 346 and the etching stopper film 344. An interconnection 356 having a diffusion preventing film 352 and a copper film 354 and connected to the interconnection 338 is formed in the via-holes 348 and the interconnection groove 350.

As shown in FIG. 35A, the interconnections 314, 338, 356 are formed in a spiral in plane, forming the so-called spiral inductor. As shown in FIG. 35B, the interconnections 338, 356 have via portions buried in a plurality of groove-shaped patterns (the via-holes 326, 348) formed along extending direction of the interconnections 338, 356, and main interconnection portions formed on the via portions. Thus, the via portions buried in the groove-shaped patterns, and a plurality of the interconnection layers are formed, whereby the inductor of low interconnection resistance can be fabricated.

As described above, the interconnections formed of mainly copper are used, and the interconnection layers are laid one on another, whereby the inductor of low interconnection resistance can be formed. On the other hand, the copper interconnection is more corrosive than the conventionally used aluminum interconnection and is difficult for wire bonding unsuitably as an uppermost interconnection layer.

Based on these views, the inventor of the present application has made studies of a new inductor structure that the uppermost interconnection layer is formed of aluminum, and an inductor is formed, including the aluminum interconnection layer. However, it has been found that the inductor including the aluminum interconnection layer has new problems which has not taken place in inductors formed of only copper interconnection layers.

FIG. 37 is the sectional view along the line B-B' in FIG. 35B. As shown in FIG. 37, when contact plugs 362 each having a barrier metal layer 358 and a tungsten film 360 and buried in the via-holes 348 and, and an interconnection 370 having a layer structure of a titanium nitride film 368/an aluminum film 366/a titanium nitride film 364 and formed on the inter-layer insulating film 342 with the contact plugs 362 buried in are formed in place of the interconnection 356, defective filling of the contact plugs 362 has often taken place at the pattern corners of the via-holes 348 (see the parts A and B in FIG. 37).

When the groove-shaped via-holes 348 are formed adjacent to each other, cracks are often made in the inter-layer insulating film 342 at the pattern corner of the outermost via-hole 348 (see the part C in FIG. 37). Also in the interconnections 338, defective filling of the interconnections 338 has often taken place at the pattern corners of the via-holes 326 (see the part D in FIG. 37).

The defective filling of the contact plugs causes poor coverage of the barrier metal layer or the aluminum film in forming the upper interconnection layer formed thereon, the transfer of steps onto the surface of the interconnection layer formed thereon, etc. (see the parts A, B and E in FIG. 37).

Defective formation of the upper interconnection layer causes electrically weak parts in the connections between the contact plug and the interconnection.

Cracks in the inter-layer insulating film are a cause of inducing diffusion of copper from the lower interconnection layer. In the case shown in FIG. 37, the etching stopper film of the diffusion preventing film and the silicon nitride film prohibits the diffusion of copper into the inter-layer insulating film. If cracks are made in the inter-layer insulating film, however, the diffusion prohibiting effect of the diffusion preventing film and the etching stopper film is lowered. Copper, which is easily diffused into silicon oxide film at certain temperatures, is a cause of lowering the breakdown voltage between the interconnections when the interconnection of a different potential is present in its neighborhood. The copper is exposed in the interface at the cracks, which is a cause of poor electromigration immunity when excessive current flows.

The defective filling of the contact plugs is true with contact plugs interconnecting a semiconductor substrate with a first interconnection layer. As exemplified in FIG. 38, in a semiconductor device comprising a silicon substrate 400 having a impurity diffused layer 402 formed therein, insulating films 404, 406, 408, 410 sequentially formed on the silicon substrate 400, contact plugs 16 formed of a barrier metal 412 and a tungsten film 414 buried in the insulating films, and an interconnection 422 formed of a diffusion preventing film 418 and a copper film 420 buried in the insulating films 408, 410, when the contact plugs 416 are formed in groove-shaped via-holes, the same defective filling as that in the parts A and B takes place at the corners of the groove-shaped via-holes.

The problems taking place in the application of the above-described interconnection structure has been explained by means of the inductor. However, the same problems take place in forming structures using the groove-shaped via patterns. For example, in the case that the groove-shaped via patterns are used in a guard ring (also called as a seal ring) for protecting the device from water from the environments, etc., the above-described defect is a cause of degrading the moisture resistance. Especially, the guard ring for a redundant circuit, which encloses a fuse region, cracks very influentially occur inside the chips.

SUMMARY OF THE INVENTION

An object of the present invention is to provide a semiconductor device having a structure that a conductor is buried in a hole-shaped pattern or a groove-shaped pattern formed in an insulating film and a method for fabricating the same, which can prevent the defective filling of the conductor and cracking of the insulating film due to the defective filling.

According to one aspect of the present invention, there is provided a semiconductor device comprising: a first insulating film formed over a substrate; a first interconnection buried in at least a surface side of the first insulating film; a second insulating film formed on the first insulating film with the first interconnection buried in, and including a groove-shaped via-hole having a pattern which is bent at a right angle formed in a region above the first interconnection; and a first buried conductor filled in the groove-shaped via-hole.

According to another aspect of the present invention, there is provided a semiconductor device comprising: a first insulating film formed over a substrate; a first interconnection buried in at least a surface side of the first insulating film, the first interconnection having a pattern which is bent at a right angle; a second insulating film formed on the first insulating film with the first interconnection buried in, and including a groove-shaped via-hole formed in a region above the first interconnection; and a first buried conductor filled in the groove-shaped via-hole, the groove-shaped via-hole being interrupted at a corner of the pattern of the first interconnection.

According to further another aspect of the present invention, there is provided a semiconductor device comprising: a first and a second impurity diffused regions formed in a semiconductor substrate; a first insulating film formed on the semiconductor substrate, and including a groove-shaped via-hole having a pattern bent at a right angle formed in a region above the first impurity diffused region and a hole-shaped via-hole formed in a region above the second impurity diffused region; a first buried conductor buried in the groove-shaped via-hole; and a second buried conductor buried in the hole-shaped via-hole, a width of the groove-shaped via-hole being 20-140% of a width of the hole-shaped via-hole.

According to further another aspect of the present invention, there is provided a method for fabricating a semiconductor device including a first insulating film formed over a substrate, a first interconnection buried in at least a surface side of the first insulating film, and a second insulating film formed on the first insulating film with the first interconnection buried in and including a groove-shaped via-hole and a hole-shaped via-hole which are opened on the first interconnection, in forming the groove-shaped via-hole and the hole-shaped via-hole in the second insulating film, a mask pattern having a design width of the groove-shaped via-hole smaller than a design width of the hole-shaped via-ole being used to form the groove-shaped via-hole and the hole-shaped via-hole.

According to further another aspect of the present invention, there is provided a method for fabricating a semiconductor device including a first insulating film formed over a substrate, a first interconnection buried in at least the surface side of the first insulating film, a second insulating film formed on the first insulating film with the first interconnection buried in and including a groove-shaped via-hole and a hole-shaped via-hole which are opened on the first interconnection, and a buried conductor buried in the groove-shaped via-hole and the hole-shaped via-hole, in forming the buried conductor, a deposited film thickness of a conducting film to be the buried conductor being set in consideration of a maximum width of the groove-shaped via-hole, so that the groove-shaped via-hole and the hole-shaped via-hole are filled by the buried conductor.

As described above, according to the present invention, in the semiconductor device having the structure that conductors are filled in the hole-shaped pattern and the groove-shaped pattern formed in the insulating films, even when a difference is generated between a finished size of the hole-shaped pattern and a finished size of the groove-shaped patterns, the defective filling of the buried conductor and the interconnections can be prevented. The defective filling of the buried conductor is prevented, whereby the cracking of the inter-layer insulating film can be prevented. Steps on the buried conductor plug can be reduced, so that the step cannot be influential on the upper interconnection layers and insulating layers. Accordingly, defective contact with the upper interconnection layer and the problems taking place in forming films can be prevented, and resultantly the semiconductor device can have high water resistance and high interconnection reliability.

DETAILED DESCRIPTION OF THE INVENTION

[Principle of the Invention]

The inventor of the present application has made earnest studies of causes of the defective filling of the buried conductor and the cracking of the inter-layer insulating film to successfully make it clear that these defects are due to a difference between a pattern size at the corner of the groove-shaped via pattern and a pattern size of the hole-shaped via pattern. The cause of the defective filling of the contact plug and the cracking of the inter-layer insulating film will be specifically explained.

Usually, structures using groove-shaped vias, such as inductors, guard rings, etc., are formed simultaneously with the interconnections inside the chips. At this time, the groove-shaped via patterns are formed simultaneously with hole-shaped patterns, as of contact holes, via-holes, etc.

Figure 1A:
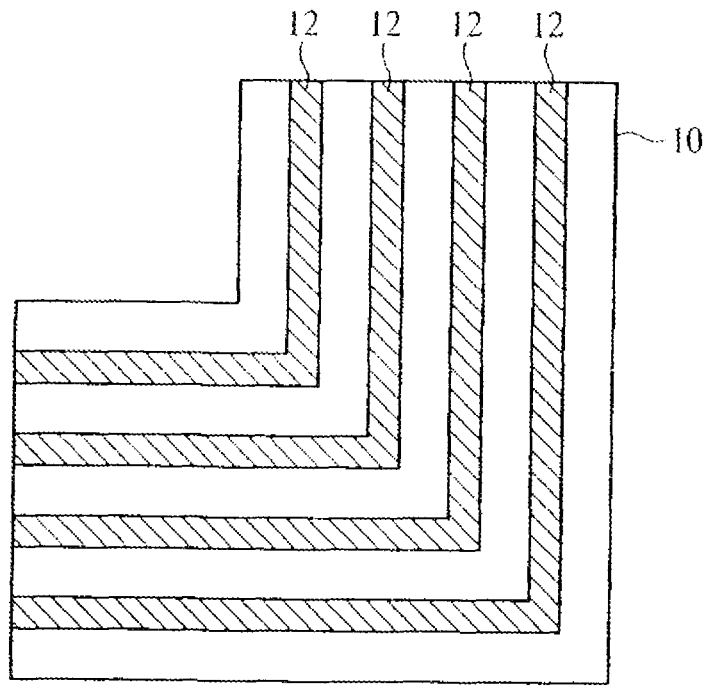
FIG. 1A is a plan view of design pattern of an inductor device region.
Figure 1B:
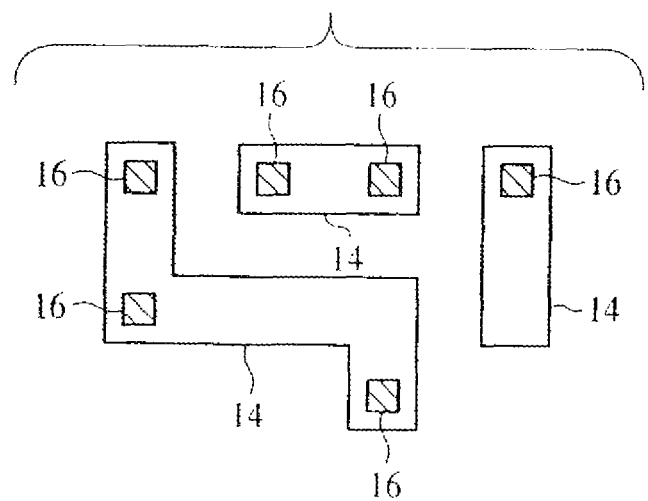
FIG. 1B is a plan view of design pattern of an ordinary inner interconnection region.

FIGS. 1A and 1B show plan views of a design pattern of an inductor device region and an ordinary inner interconnection region. FIG. 1A is a partial plan view of the inductor device. FIG. 1B is a partial plan view of the inner interconnection region.

FIGS. 1A and 1B show patterns of base interconnection layers and patterns of contact plugs formed on the interconnection layers. In the inductor device region shown in FIG. 1A, 4, for example, groove-shaped via patterns 12 are formed along the extending direction of an interconnection 10. In the inner interconnection region shown in FIG. 1B, rectangular via-holes 16 are formed down to interconnections 14. Generally, it is often that groove-shaped via patterns used in a guard ring, an inductors, etc. are designed to have a width or a diameter equal to that of patterns of an inner circuit pattern. In the design shown in FIGS. 1A and 1B as well, the width of the groove-shaped via patterns and the width (diameter) of the via-holes are designed to be the same.

However, suitable exposure conditions required to form design pattern sizes are different between the hole-shaped via pattern and the groove-shaped via pattern. In concurrently forming the hole-shaped via patterns and the groove-shaped via patterns, even when a width of the hole-shaped via patterns and a width of the groove-shaped via patterns are made equal to each other in design data, the finished sizes are different from each other.

When the groove-shaped via patterns are exposed with an exposure condition suitable to form the hole-shaped via patterns as designed, the exposure amount is higher than a suitable exposure amount for the groove-shaped via pattern. The groove-shaped via pattern is wider than a design value. Furthermore, exposure light advances in two directions toward the corner of the groove-shaped via pattern, which widens the groove-shaped via patterns by a higher degree there.

Figure 2A:
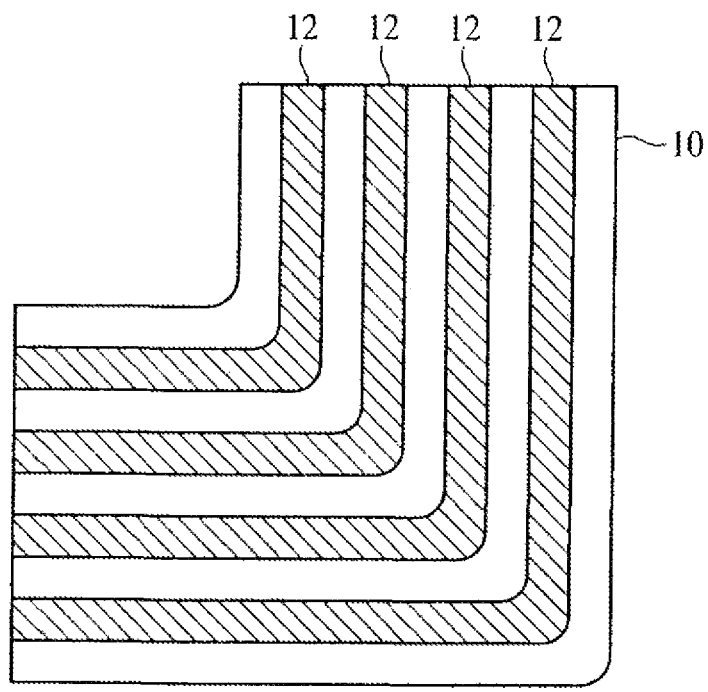
FIG. 2A is a plan view of the finished pattern images of the inductor device region on a wafer.
Figure 2B:
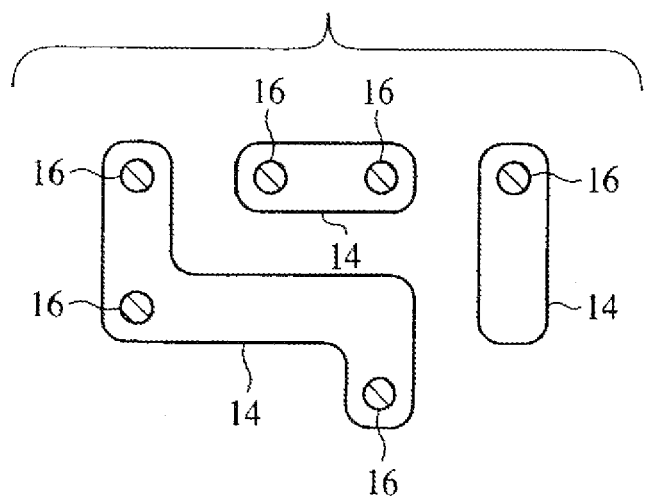
FIG. 2B is a plan view of the finished pattern images of the ordinary inner interconnection region on a wafer.

FIGS. 2A and 2B are plan views of the images of the finished patterns formed on a wafer, based on the design date shown in FIGS. 1A and 1B, in consideration of the above-described pattern size shift. FIG. 2A is a partial plan view of the patterns in the inductor device region, and FIG. 2B is a partial plan view of the patterns in the inner interconnection region. As shown, even in using the rectangular patterns as shown in FIGS. 1A and 1B, the corners of the finished patterns are a little rounded by the proximity effect. Besides, a finished size varies depending on a shape of the patterns. For example, when a design size of the diameter of the via-holes 16 was 0.50 μm, and a design size of the groove-shaped via pattern 12 was 0.50 μm, the finished diameter of the via-holes 16 on a wafer was 0.50 μm, and the finished width of the groove-shaped via patterns on the wafer was 0.55 μm. At this time, a design size of the corners of the groove-shaped via patterns was 0.71 μm (0.50 μm×√2), but the finished size was 0.80 μm.

Figure 3A:
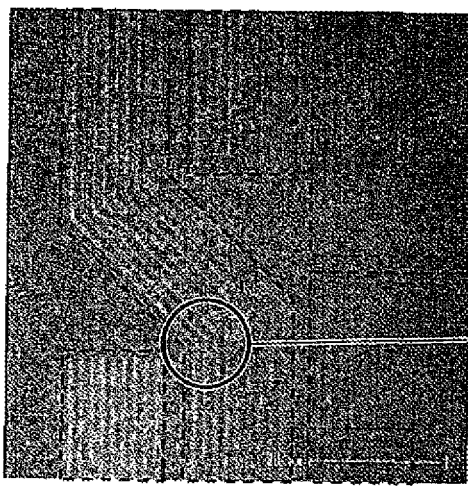
FIGS. 3A-3F are images of the inductor device region observed by a scanning electron microscope.
Figure 3B:
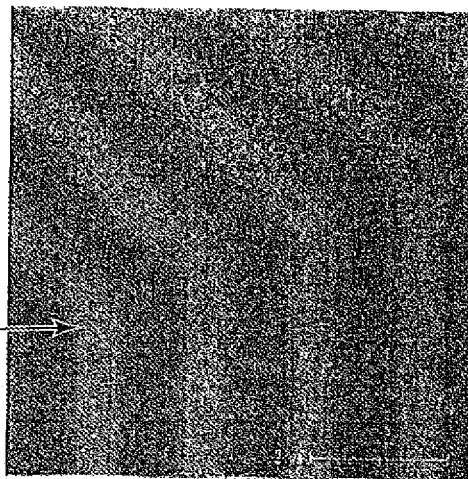
Figure 3C:
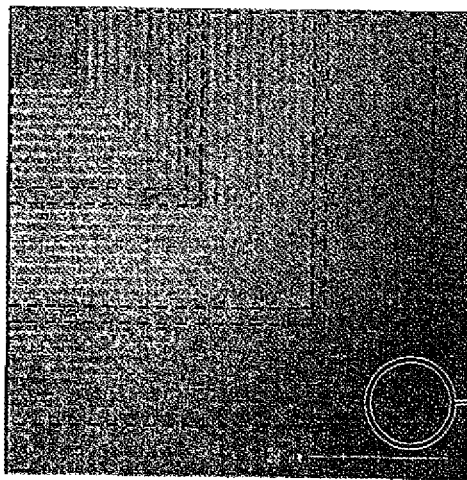
Figure 3D:
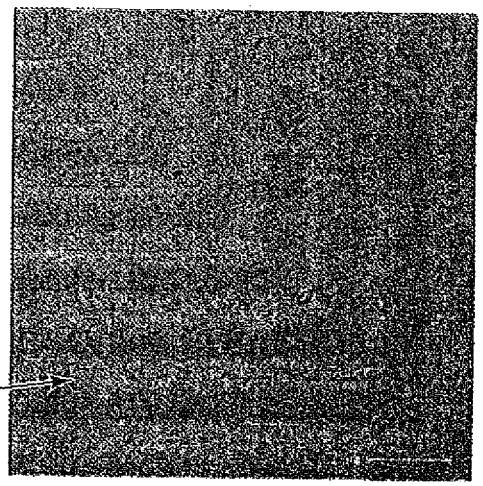
Figure 3E:
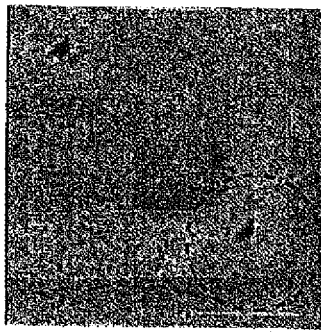
Figure 3F:
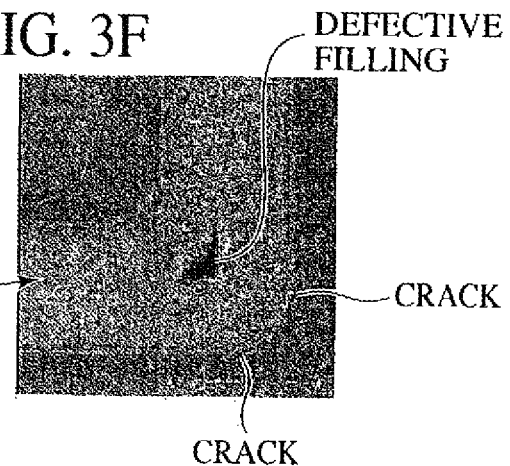

FIGS. 3A-3F are images of the inductor device region on an actual wafer, which were observed by a scanning electron microscope. As shown in FIGS. 3A and 3B, the defective filling has not taken place in the parts where the groove-shaped via patterns are linearly extended and the parts where the groove-shaped via patterns are bent at 135°. However, in the parts where the groove-shaped via patterns are bent by 90°, as shown in FIGS. 3C and 3D, the defective filling of the groove-shaped via patterns has taken place. As shown in FIGS. 3E and 3F, cracks have been made in the outer side of the corner of the outermost groove-shaped via pattern.

Considering the above-described phenomena, the defective filling of the groove-shaped vias will be due to the above-described pattern size shift. That is, when conditions for forming the contact plugs are optimized in accordance with the via-holes 16, the filling of the contact plugs will be insufficient at the corners of the groove-shaped via patterns.

As for causes of the cracking of the inter-layer insulating film, the inventor's studies have been able to confirm the following phenomena. 1) The place where the cracks are made is the outer side of the corner of the outermost groove-shaped via pattern. 2) When the groove-shaped vias are sufficiently filled, no cracks are made in the inter-layer insulating film. 3) When the base is not a copper interconnection (but, e.g., an aluminum interconnection), no cracks are made in the inter-layer insulating film even when the defective filling has taken place in the groove-shaped vias. Considering these points, the cracking of the inter-layer insulating film will be due to the thermal expansion coefficient difference between the lower copper interconnection and the upper tungsten plugs. The thermal expansion coefficient difference between the two generates a tensile stress toward the inside of the pattern corner, and a void formed by the defective filling accelerates shrinkage of the tungsten plugs, whereby cracks are made in the inter-layer insulating film at the pattern corner.

Accordingly, in order to prevent cracking of the inter-layer insulating film, some countermeasures for the defective filling of the groove-shaped vias may be taken. To prevent the defective filling of the groove-shaped vias it is considered 1) to contrive the patterns and 2) to optimize the process.

As described above, a main cause of the defective filling of the groove-shaped vias will be the size shift of the groove-shaped via patterns. Accordingly, for the above-described countermeasure 1), contrivances that design pattern sizes are set in consideration of a difference of finished sizes of the hole-shaped via pattern and the groove-shaped via pattern; a bend angle of the groove-shaped via pattern is made large; a width of the groove-shaped via pattern is made smaller selectively at the corner thereof; the groove-shaped via patterns have no corners; etc. are considered. From the viewpoint that only the cracking of the inter-layer insulating film is prevented, the above-described contrivances may be applied to at least the outermost groove-shaped via pattern. As for the above-described countermeasure 2), it is considered to make a film thickness of the tungsten film forming the contact plugs to be buried in to thereby completely fill the groove-shaped via pattern.

The above-described contrivances for the pattern may be applied to the pattern of the copper interconnection below the groove-shaped vias. It is true with the damascene interconnection that the defective filling tends to occur at the corner of the groove-shaped vias.

[A First Embodiment]

The semiconductor device and the method for fabricating the same according to a first embodiment of the present invention will be explained with reference to FIGS. 4A-4B, 5, 6, 7A-7C, 8A-8C, 9A-9B, 10A-10B, 11A-11B, 12A-12B, 13A-13B, and 14.

Figure 4A:
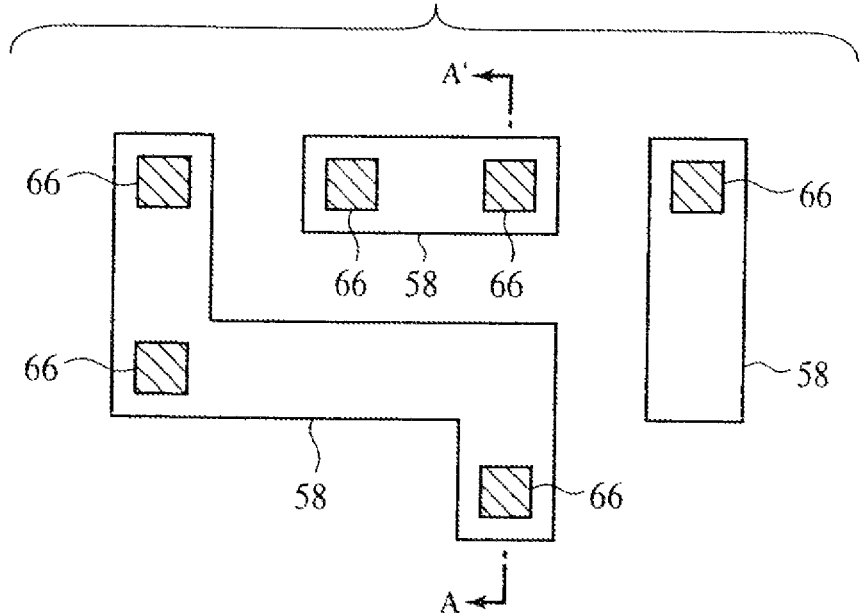
FIGS. 4A and 4B are plan views of a design structure of the semiconductor device according to a first embodiment of the present invention, which show the structure thereof.
Figure 4B:
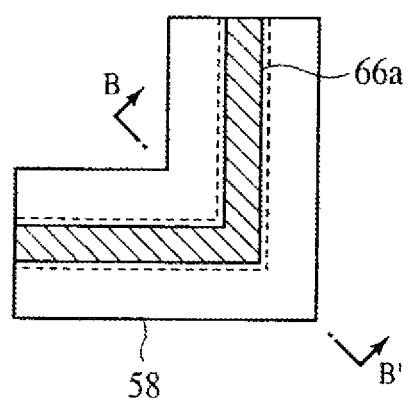
Figure 5:
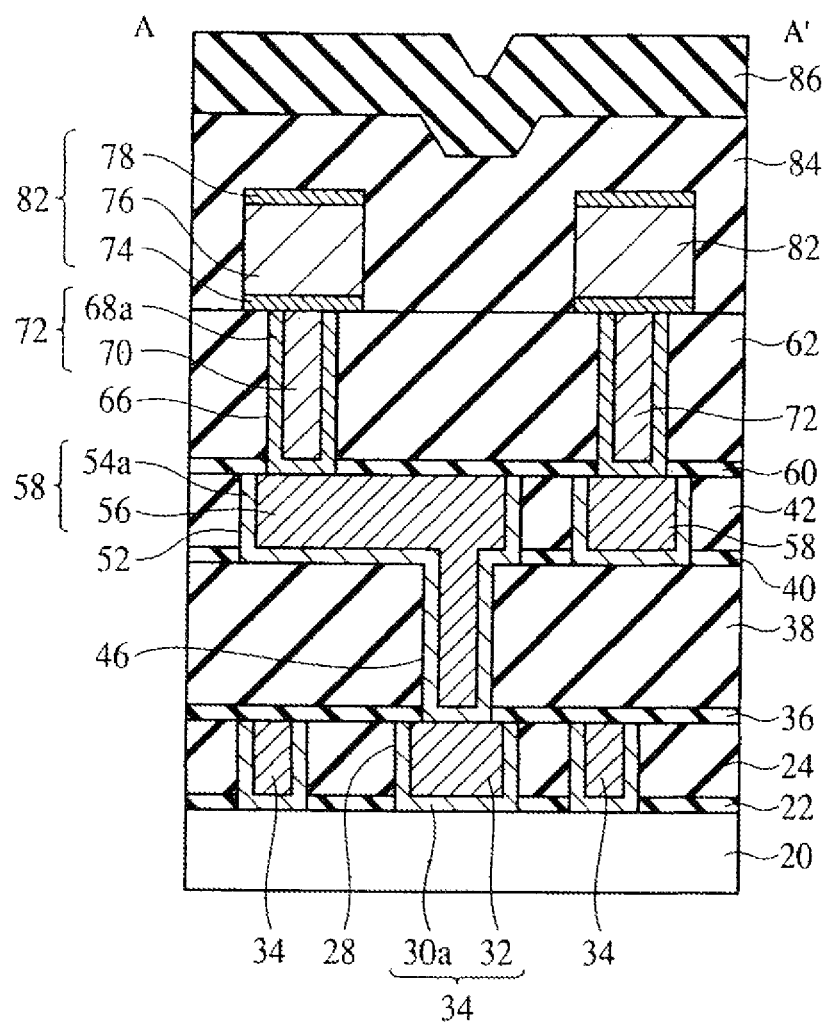
FIGS. 5 and 6 are diagrammatic sectional views of the semiconductor device according to the first embodiment of the present invention, which show the structure thereof.
Figure 6:
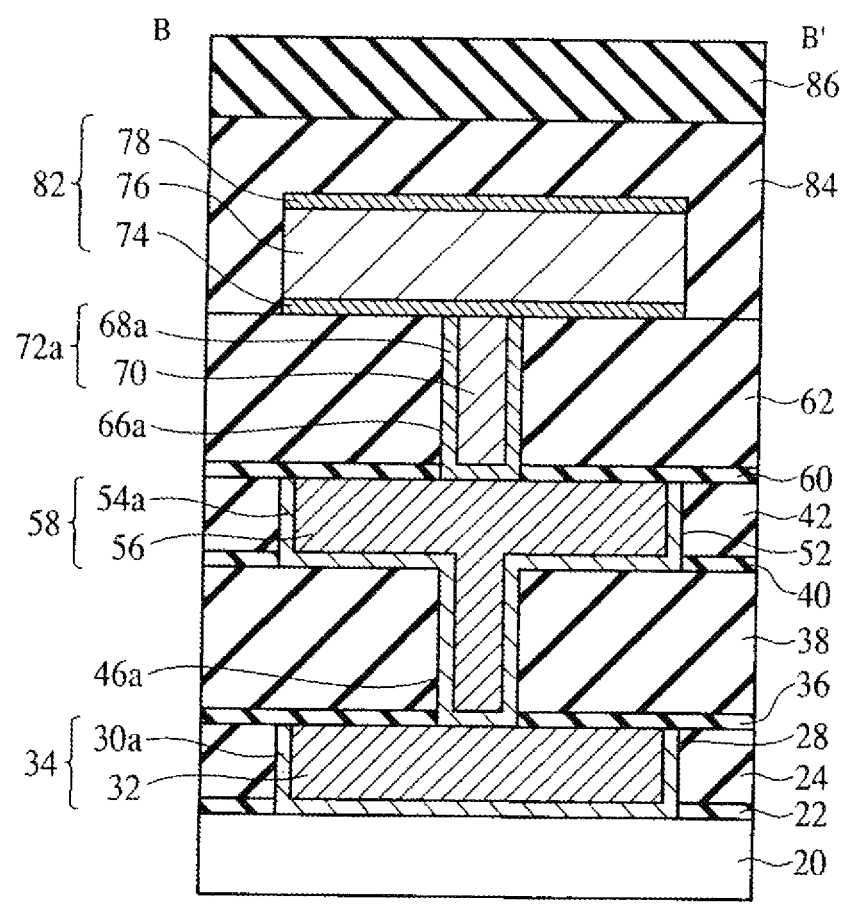

FIGS. 4A and 4B are plan views of a design structure of the semiconductor device according to the present embodiment. FIGS. 5 and 6 are diagrammatic sectional views of the semiconductor device according to the present embodiment, which show the structure. FIGS. 7A to 14 are sectional views of the semiconductor device according to the present embodiment in the steps of the method for fabricating the same, which show the method.

First, the structure of the semiconductor device according to the present embodiment will be explained with reference to FIGS. 4A to 6. FIG. 4A is a partial plan view of a design structure of the inner circuit region of the semiconductor device according to the present embodiment. FIG. 4B is a partial plan view of a design structure of the groove-shaped via pattern forming region of the semiconductor device according to the present embodiment. FIG. 5 is a diagrammatic sectional view of the semiconductor device along the line A-A' in FIG. 4A. FIG. 6 is a diagrammatic sectional view of the semiconductor device along the line B-B' in FIG. 4B.

The semiconductor device according to the present embodiment includes the inner circuit region and the groove-shaped via pattern forming region. Here, the inner circuit region means the ordinary device region including a structure of an upper and a lower interconnection layers interconnected to each other through via-holes (hole-shaped vias). The grooved via pattern region means a region where a structure using groove-shaped via-holes is formed, and is, e.g., an inductor device region and a guard ring region around a fuse circuit, a chip or others. FIG. 4B is a view of the enlarged corner of the groove-shaped via pattern, and the groove-shaped via pattern is formed, extended upward and left as viewed in the drawing.

An etching stopper film 22 and an inter-layer insulating film 24 are formed on a substrate 20. In the specification of the present application, the substrate 20 can be a semiconductor substrate itself, and can also include a semiconductor substrate with semiconductor elements, such as transistors, etc., formed on and such substrate with one or more interconnection layers further formed on.

Interconnection grooves 28 are formed in the inter-layer insulating film 24 and the etching stopper film 22. Interconnections 34 each including a diffusion preventing film 30a and a copper film 32 are formed in the interconnection grooves 28.

An etching stopper film 36 and an inter-layer insulating film 38 are formed on the inter-layer insulating film 24 with the interconnections 34 buried in. As shown in FIG. 4A and FIG. 5, a via-hole 46 is formed in the inter-layer insulating film 38 and the etching stopper film 36 in the inner circuit region down to the interconnection 34. In the inter-layer insulating film 38 and the etching stopper film 36 in the groove-shaped via pattern forming region, as shown in FIG. 4B and FIG. 6, a groove-shaped via-hole 46a is formed. An etching stopper film 40 and an inter-layer insulating film 42 are formed on the inter-layer insulating film 38. Interconnection grooves 52 are formed in the inter-layer insulating film 42 and the etching stopper film 40. Interconnections 58 each including a diffusion preventing film 54a and a copper film 56 are formed in the via-holes 46, 46a and the interconnection groove 52, electrically connected to the interconnection 34.

An etching stopper film 60 and an inter-layer insulating film 62 are formed on the inter-layer insulating film 42 with the interconnections 58 buried in. As shown in FIG. 4A and FIG. 5, via-holes 66 are formed down to the interconnection 58 in the inter-layer insulating film 62 and the etching stopper film 60 in the inner circuit region. In the inter-layer insulating film 62 and the etching stopper film 60 in the groove-shaped via pattern forming region, as shown in FIG. 4B and FIG. 6, a groove-shaped via-hole 66a is formed. Contact plugs 72 each including a barrier metal layer 68a and a tungsten film 70 are formed in the via-holes 66. A groove-shaped contact plug 72a including the barrier metal layer 68a and the tungsten film 70 is formed in the via-hole 66a.

Interconnections 82 of a layer structure of a titanium nitride film 78/an aluminum film 76/a titanium nitride film 74 are formed on the inter-layer insulating film 62 with the contact plugs 72, 72a buried in. A cover film including a silicon oxide film 84 and a silicon nitride film 86 is formed on the inter-layer insulating film 62 with the interconnections 82 formed on.

The semiconductor device according to the present embodiment is characterized mainly in that the diameter of the hole-shaped via-holes 66 and the width of the groove-shaped via-hole 66a are different from each other in the design pattern size. That is, in FIG. 4B, the groove-shaped via-hole 66a having the width which is equal to the diameter of the via-holes 66 is drawn in the dotted line. The outer edge of the design pattern of the via-hole 66a is positioned inner of the dotted line.

For example, when a diameter of the via-holes 66 is designed to be 0.5 μm, a width of the via-hole 66a is designed to be 0.4 μm. Even when exposure with a suitable exposure condition for forming the via-holes 66 in the design size overexposes for forming the via-hole 66a, a finished width of the via-hole 66a can be substantially equal to a finished diameter of the via-holes 66. Accordingly, when the via-holes 66 are filled with the contact plugs 72, the via-hole 66a can be also filled with the contact plug 72a.

A shift amount of the pattern size between the hole-shaped patterns and the groove-shaped pattern on a wafer varies corresponding to characteristics, etc. of the aligner, the etching system, etc. Accordingly, how much a width of the via-hole 66a is decreased with respect to a diameter of the via-holes 66 is preferably set suitably corresponding to a shift amount of the pattern size between the hole-shaped patterns and the groove-shaped pattern on a wafer.

It is important that a finished width of the via-hole 66a is set so that when the contact plugs 72 are buried in the via-holes 66, the contact plug 72a is completely filled in the via-hole 66a. Thus, the finished width of the via-hole 66a is not essentially equal to the finished diameter of the via-holes 66. As long as the via-hole 66a has a width which permits the contact plug 72a to be completely filled in the via-hole 66a, a diameter of the via-holes 66 can be larger or smaller than a finished width of the via-hole 66a.

The device of the generations the inventor of the present invention has made studies of uses a 0.5 μm hole-shaped via diameter. In this case, the defective filling did not take place in the groove-shaped via whose width was not more than about 140% of the hole-shaped via diameter, i.e., about 0.7 μm. On the other hand, a minimum width required by the groove-shaped via cannot be generally said because the minimum width depends on a resolution of the aligner and a thickness of the barrier metal layer, but the groove-shaped via having a width of not less than about 20% of a diameter of the hole-shaped vias will not hinder the formation of the contact plug. When conditions for forming the contact plug is optimized based on a hole-shaped via diameter, it is reasonable to design a width of the groove-shaped via to be smaller than a width of the hole-shaped vias.

When the defective filling of the via-hole 46a takes place in the process of forming the interconnections 58, a width of the via-hole 46a may be suitably designed as described above.

Generally, when the hole-shaped patterns and the groove-shaped pattern are concurrently formed, the groove-shaped pattern is substantially overexposed. Accordingly, a finished width of the groove-shaped pattern is substantially equal to a finished width of the hole-shaped patterns, or a finished width of the groove-shaped pattern is smaller than a finished width of the hole-shaped patterns, a design size of the groove-shaped pattern will be made smaller than a design size of the hole-shaped patterns.

Next, the method for fabricating the semiconductor device according to the present embodiment will be explained with reference to FIGS. 7A to 14. The inner circuit region and the groove-shaped via pattern forming region are different from each other in plane layout but are not different from each other in the fabrication steps. The method for fabricating the semiconductor device according to the present embodiment will be explained below with reference to the sectional views of the inner circuit region.

First, an etching stopper film 22 of a 50 nm-thick silicon nitride film and an inter-layer insulating film 24 of a 500 nm-thick silicon oxide film are sequentially formed on a substrate 20 by, e.g., CVD.

Figure 7A:
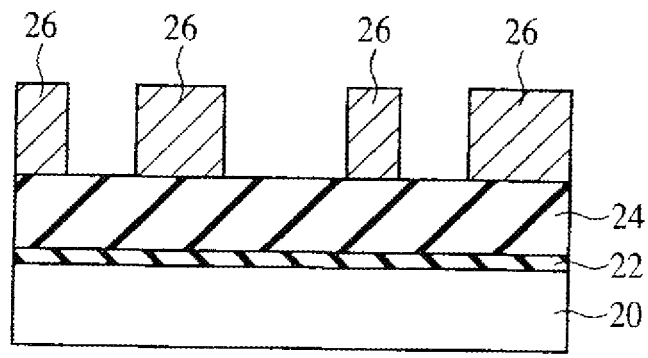
FIGS. 7A-7C, 8A-8C, 9A-9B, 10A-10B, 11A-11B, 12A-12B, 13A-13B, and 14 are sectional views of the semiconductor device according to the first embodiment of the present invention in the steps of the method for fabricating the same, which show the method.

Next, a photoresist film 26 exposing regions for forming interconnections is formed on the inter-layer insulating film 24 by photolithography (FIG. 7A).

Then, under etching conditions which provide a sufficient selective ratio with respect to the silicon nitride film, and with the photoresist film 26 as a mask and with the etching stopper film 22 as a stopper, the inter-layer insulating film 24 is anisotropically etched to form the interconnection grooves 28 in the inter-layer insulating film 24.

Then, the photoresist film 26 is removed by asking using, e.g., oxygen plasma.

Figure 7B:
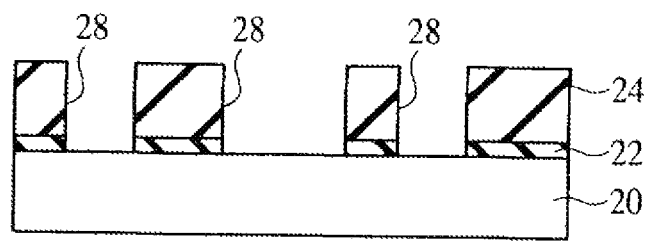

Then, under etching conditions which provide a sufficient selective ratio with respect to the silicon oxide film, and with the inter-layer insulating film 24 with the interconnection grooves 28 formed in as a mask, the etching stopper film 22 is anisotropically etched to open the interconnection grooves 28 down onto the substrate 20 (FIG. 7B).

The etching stopper film is etched after the photoresist film 26 has been removed so as to prevent the substrate 20 from being damaged by ashing for removing the photoresist film 26. In a case where any layers to be damaged by ashing (e.g., a copper interconnection or others) are not formed on the top of the substrate 20, the inter-layer insulating film 24 and the etching stopper film 22 may be continuously etched with the photoresist film 26 as a mask.

Figure 7C:
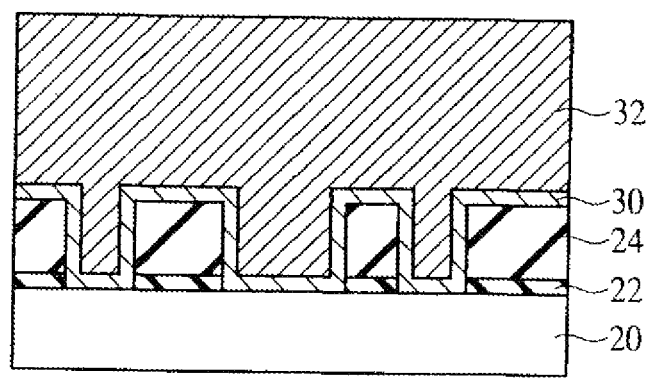

Then, a 50 nm-thick tantalum film 30 and a 1500 nm-thick copper film 32 are deposited on the entire surface by, e.g., sputtering (FIG. 7C). It is possible that the tantalum film 30, and a thin copper film (not shown) as a seed layer are deposited by sputtering, and the copper film 32 is formed by plating with the copper film as a seed.

Figure 8A:
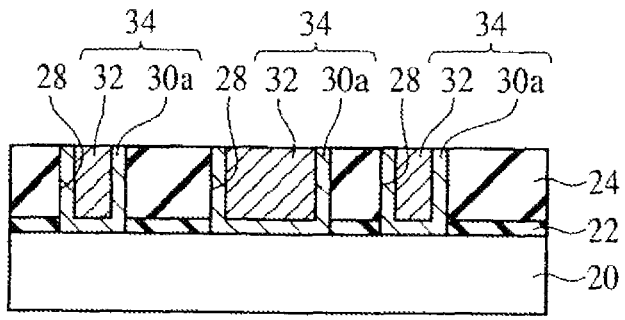

Then, the copper film 32 and the tantalum film 30 are planarly removed by, e.g., chemical mechanical polishing (CMP) until the inter-layer insulating film 24 is exposed. The interconnections 34 filled in the interconnection grooves 28 and including the diffusion preventing film 30a for preventing the diffusion of copper and formed of the tantalum film 30, and the copper film 32 forming the major part of the interconnections 34 are thus formed (FIG. 8A).

Then, the etching stopper film 36 of a 50 nm-thick silicon nitride film, the inter-layer insulating film 38 of a 750 nm-thick silicon oxide film, the etching stopper film 40 of a 50 nm-thick silicon nitride film, and the inter-layer insulating film 42 of a 500 nm-thick silicon oxide film are sequentially formed by, e.g., CVD on the inter-layer insulating film 24 with the interconnections 34 buried in. The etching stopper film 36 functions also as a diffusion preventing film for preventing the diffusion of the copper from the interconnections 34.

In a case where steps are formed due to dishing, etc. in the step of forming the interconnections 34, it is possible that the inter-layer insulating film 38 is deposited in a thickness larger than a prescribed thickness and polished planarly to the prescribed thickness by CMP, and then the etching stopper film 40 is deposited.

Figure 8B:
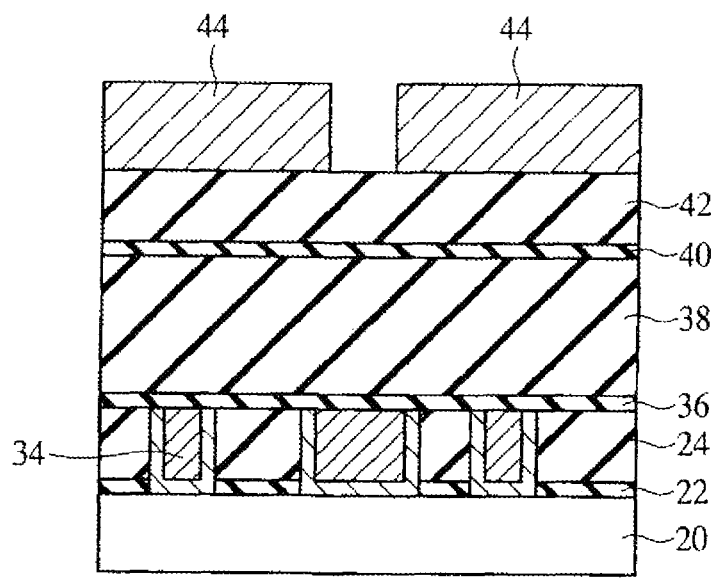

Then, a photoresist film 44 exposing the regions where the via-holes 46, 46a are to be formed in the inter-layer insulating film 38 is formed on the inter-layer insulating film 42 by photolithography (FIG. 8B).

Next, with the photoresist film 44 as a mask and with the etching stopper film 36 as a stopper, the inter-layer insulating film 42, the etching stopper film 40 and the inter-layer insulating film 38 are sequentially anisotropically etched with etching conditions changed to form the via-holes 46 in the inter-layer insulating film 38 in the inner circuit region and the via-hole 46a in the inter-layer insulating film in the groove-shaped via pattern forming region.

In a case where the defective filling takes place in the interconnection 58, which will be formed later, it is possible that a photomask is designed so that a design diameter of the via-holes 46 and a design width of the via-hole 46a are different from each other, and the photoresist film 44 is formed by using the photomask. When a design diameter of the via-holes 46 is, e.g., 0.5 µm, a design width of the via-hole 46a is set to be, e.g., 0.4 µm, whereby the finished diameter of the via-holes 46 can be substantially equal to the finished width of the via-hole 46a, and the defective filling of the interconnection 58 can be precluded.

Figure 8C:
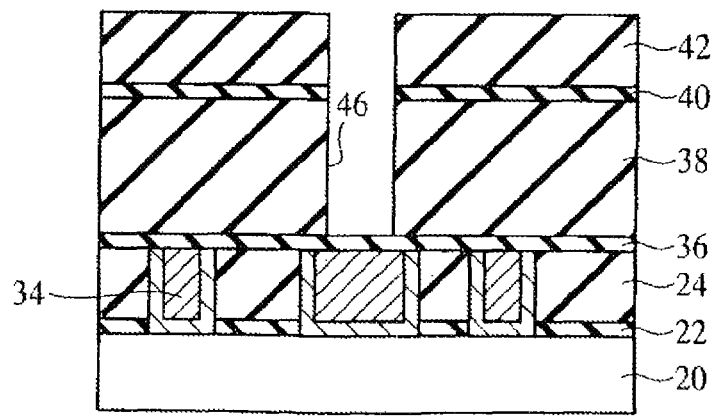

Then, the photoresist film 44 is removed by asking using, e.g., oxygen plasma (FIG. 8C).

Next, a non-photosensitive resin 48 is applied by, e.g., spin coating, and then the non-photosensitive resin 48 on the inter-layer insulating film. 42 is dissolved and removed while the non-photosensitive resin 48 in the via-holes 46 is left.

Figure 9A:
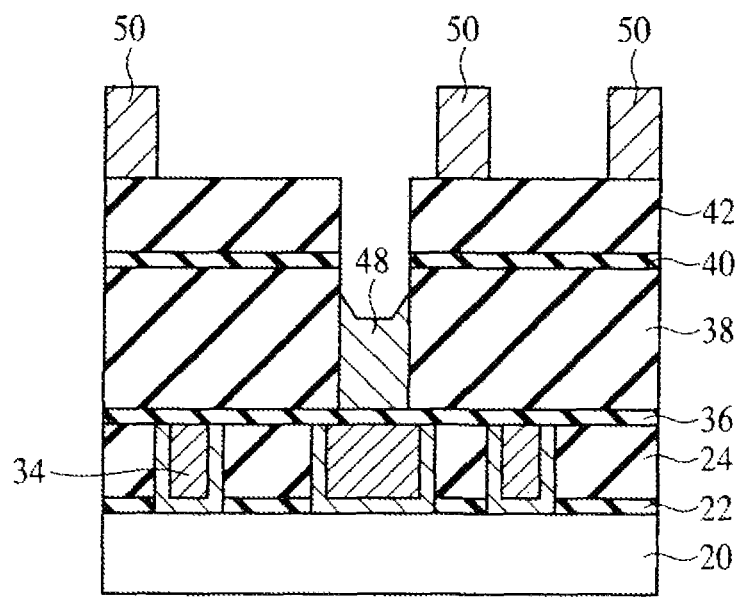

Then, a photoresist film 50 exposing a region where the interconnection to be formed in the inter-layer insulating film 42 is formed on the inter-layer insulating film 42 by photolithography (FIG. 9A). The photoresist film 50 is selected out of materials which do not mix with the non-photosensitive resin 40 and a developer of which does not solve the non-photosensitive resin 40.

Under etching conditions which can provide a sufficient selective ratio with respect to the silicon nitride film, with the photoresist film 50 as a mask and with the etching stopper film 40 as a stopper, the inter-layer insulating film 42 is anisotropically etched to form the interconnection grooves 52 in the inter-layer insulating film 42.

Figure 9B:
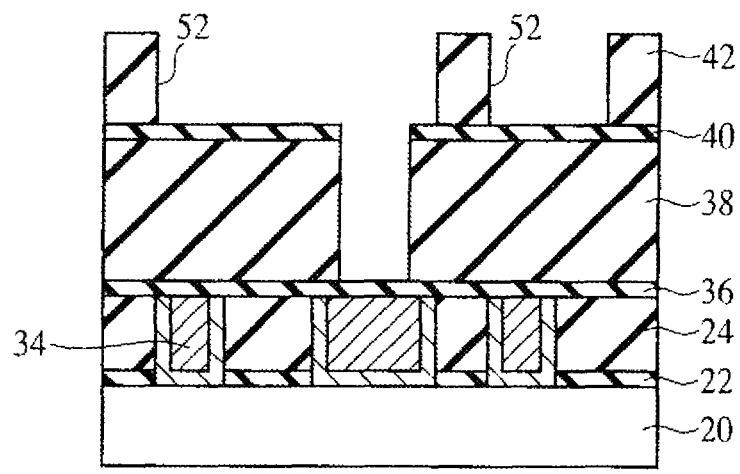

Then, the photoresist film 42 and the non-photosensitive resin 40 are removed by asking using, e.g., oxygen plasma (FIG. 9B).

Figure 10A:
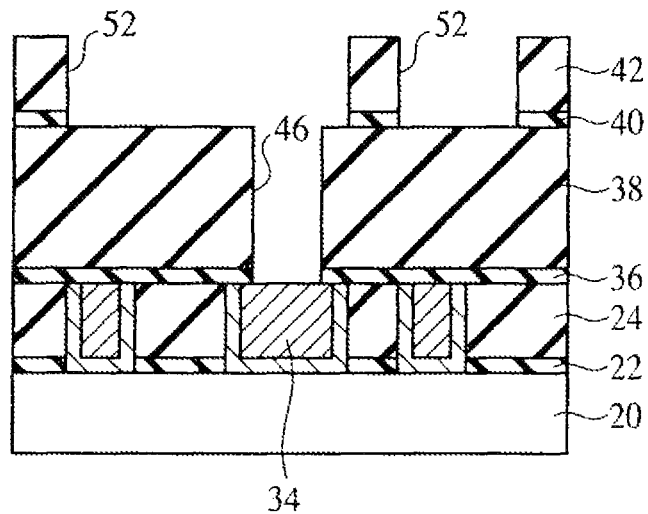
Figure 10B:
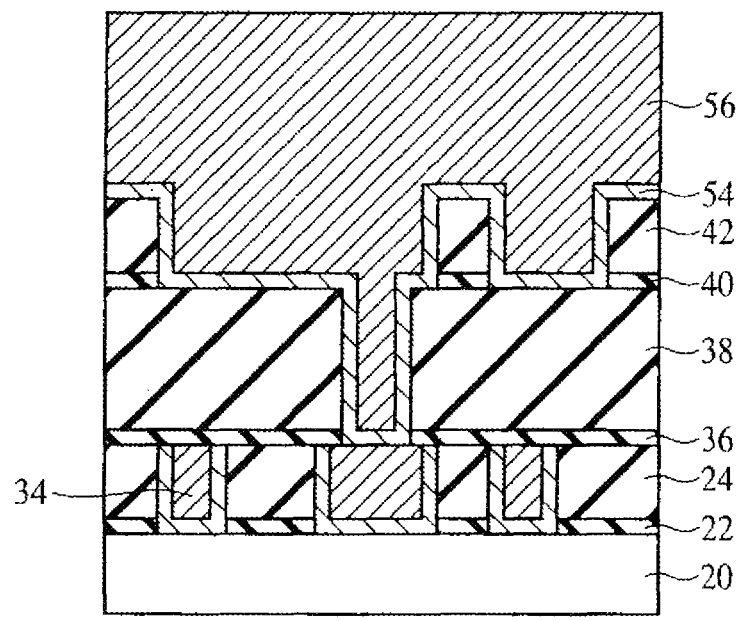

Next, the etching stopper films 36, 40 are anisotropically etched under etching conditions which can provide a sufficient selective ratio with respective to the silicon oxide film and with the inter-layer insulating film 42 with the interconnection grooves 52 formed in and the inter-layer insulating film 38 with the via-holes 46 formed in as masks to open the interconnection grooves 52 down onto the inter-layer insulating film 38 and to open the via-holes 46 down onto the interconnection 34 (FIG. 10A).

Then, a 50 nm-thick tantalum film 54 and a 1500 nm-thick copper film 56 are deposited on the entire surface by, e.g., sputtering. It is possible that the tantalum film 54, and a thin copper film (not shown) as a seed layer are deposited by sputtering, and then with the copper film as a seed, the copper film 56 of a prescribed thickness is formed by plating.

Figure 11A:
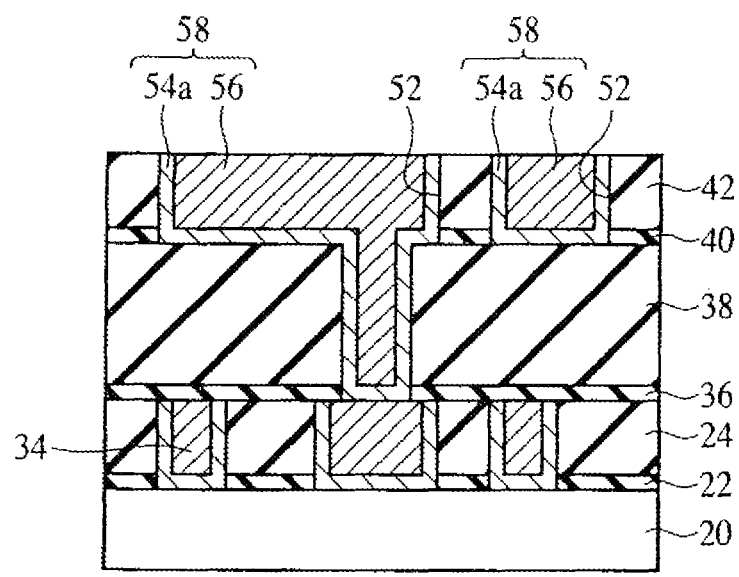

Next, the copper film 56 and the tantalum film 54 are planarly removed by, e.g., CMP until the inter-layer insulating film 42 is exposed. Thus, the interconnections 58 which is filled in the interconnection grooves 52 and the via-holes 46 and includes the diffusion preventing film 54a formed of the tantalum film 54 for preventing the diffusion of the copper, and the copper film 56 which forms the major part of the interconnection are thus formed (FIG. 11A).

Then, the etching stopper film 60 of a 50 nm-thick silicon nitride film, and the inter-layer insulating film 62 of a 750 nm-thick silicon oxide film are sequentially deposited by, e.g., CVD on the inter-layer insulating film 42 with the interconnections 58 buried in. The etching stopper film 60 functions also as the diffusion preventing film for preventing the diffusion of the copper from the interconnection 58.

In a case where steps are formed due to dishing, etc. in the step of forming the interconnection 58, it is possible that the inter-layer insulating film 62 is deposited in a thickness larger than a prescribed thickness and polished planarly to the prescribed thickness by CMP.

Figure 11B:
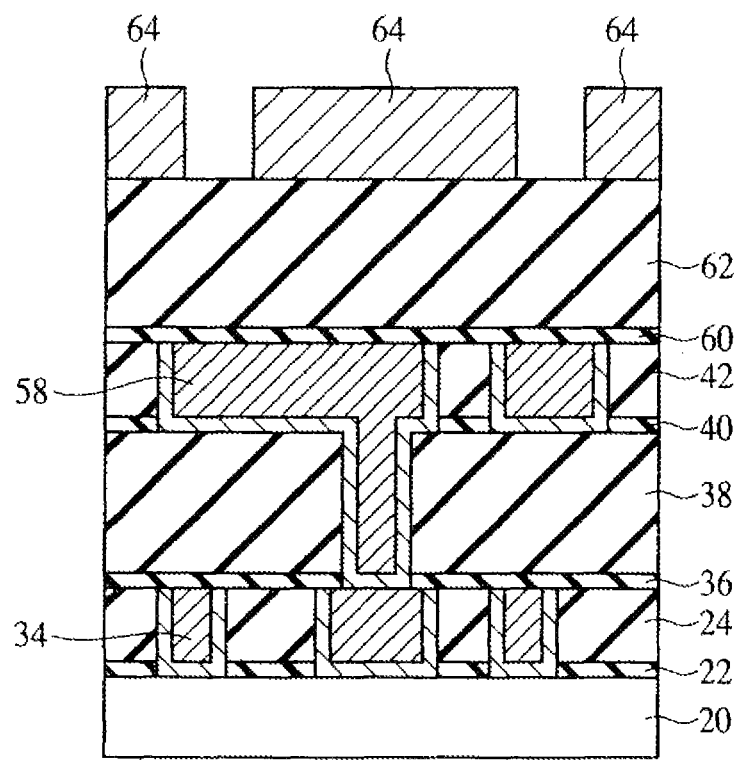

Then, a photoresist film 64 exposing regions where the via-holes 66, 66a are to be formed in the inter-layer insulating film 62 is formed on the inter-layer insulating film 62 by photolithography (FIG. 11B). As shown in FIG. 4, the photomask is designed so that a design diameter of the via-holes 66 and a design width of the via-hole 66a are different from each other, and the photoresist film 64 is formed by using the photomask.

Next, the inter-layer insulating film 62 is anisotropically etched with the photoresist film 64 as a mask and with the etching stopper film 60 as a stopper to form the via-holes 66 in the inter-layer insulating film 62 in the inner circuit region and the via-hole 66a in the inter-layer insulating film 62 in the groove-shaped via pattern forming region. When the design diameter of the via-holes 66 is, e.g., 0.5 µm, and the design width of the via-hole 66a is, e.g., 0.4 µm, the finished diameter of the via-holes 66 and the finished width of the via-hole 66a are both about 0.5 µm.

Then, the photoresist film 64 is removed by asking using, oxygen plasma.

Figure 12A:
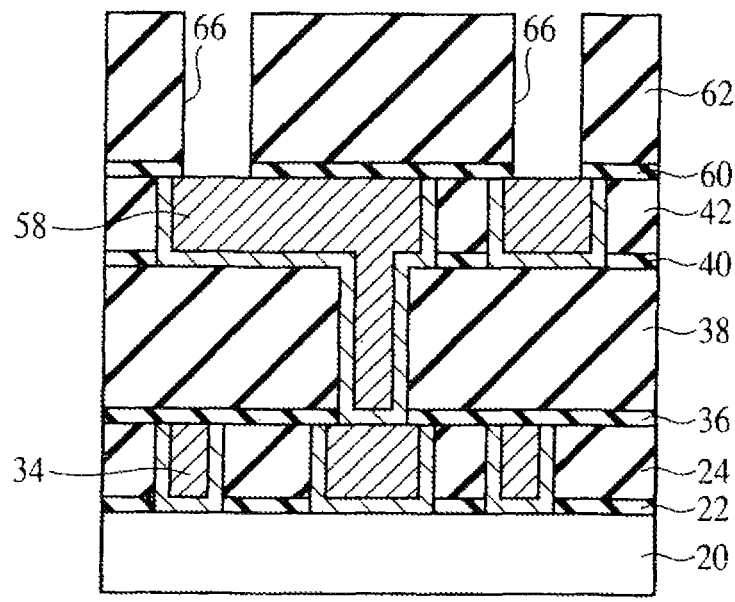

Next, under etching conditions which can provide a sufficient selective ratio with respect to the silicon oxide film and with the inter-layer insulating film 62 with the via-holes 66 formed in as a mask, the etching stopper film 60 is anisotropically etched to open the via-holes 66, 66a down onto the interconnection 58 (FIG. 12A).

Figure 12B:
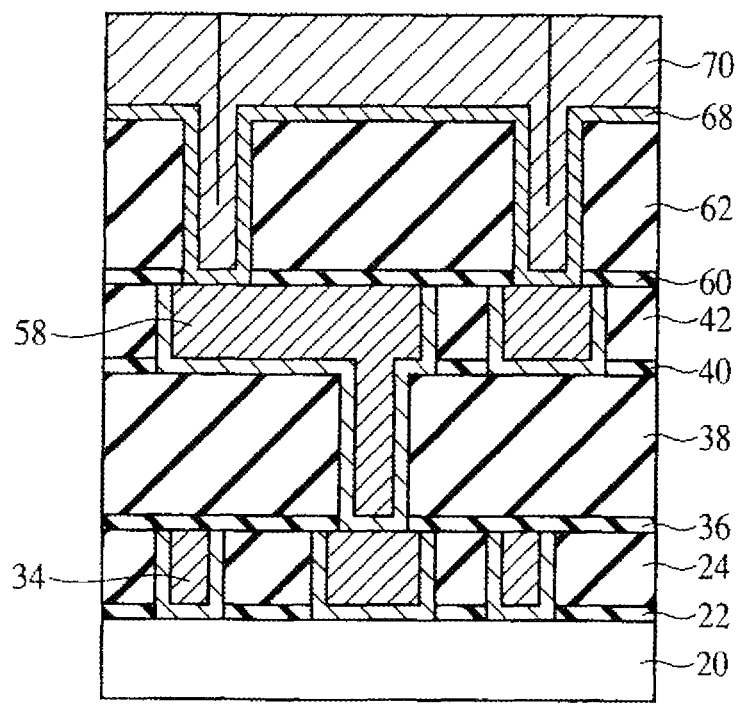

Then, a 50-nm-thick titanium nitride film and a 300 nm-thick tungsten film 70 are sequentially formed respectively by, e.g., sputtering and CVD (FIG. 12B).

Figure 13A:
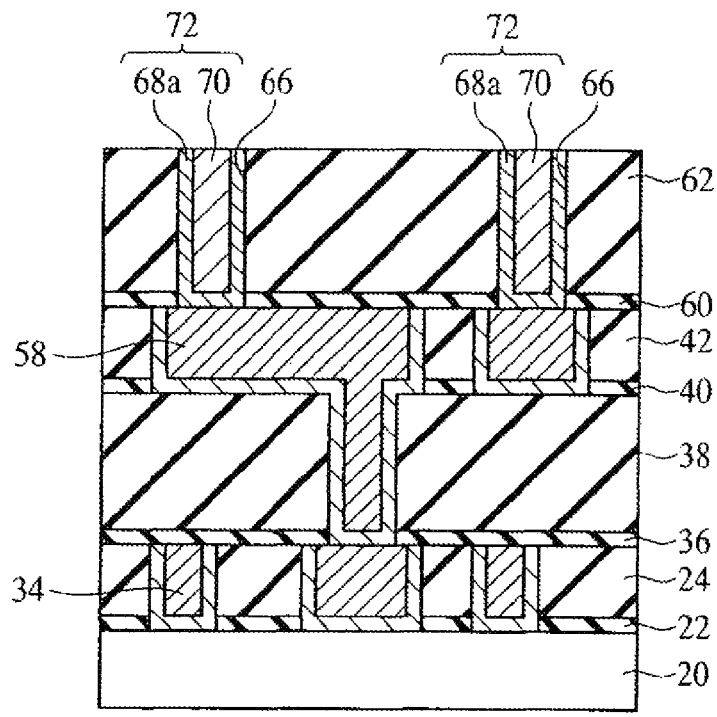

Next, the tungsten film 70 and the titanium nitride film 68 are planarly removed by, e.g., CMP until the inter-layer insulating film 62 is exposed. The contact plugs 72 filled in the via-holes 66 and including the barrier metal layer 68a formed of the titanium nitride film 68 and the tungsten film 70, and the contact plugs 72a filled in the via-hole 66a and including the barrier metal layer 68a formed of the titanium nitride film 68 and the tungsten film. 70 are thus formed (FIG. 13A).

At this time, the finished diameter of the via-holes 66 and the finished width of the via-hole 66a are substantially equal to each other. The contact plugs 72 are formed under conditions for completely filling the via-holes 66, whereby the defective filling of the contact plug 72a can be prevented. In a case that the groove-shaped contact plugs are disposed adjacent to each other, the effect of preventing the cracking of the inter-layer insulating film 62 is provided.

Next, on the inter-layer insulating film 70 with the contact plugs 72, 72a buried in, a 50 nm-thick titanium nitride film 74, a 1000 nm-thick aluminum (or copper added aluminum) film 76 and a 50 nm-thick titanium nitride film 78 are sequentially deposited by, e.g., sputtering.

Figure 13B:
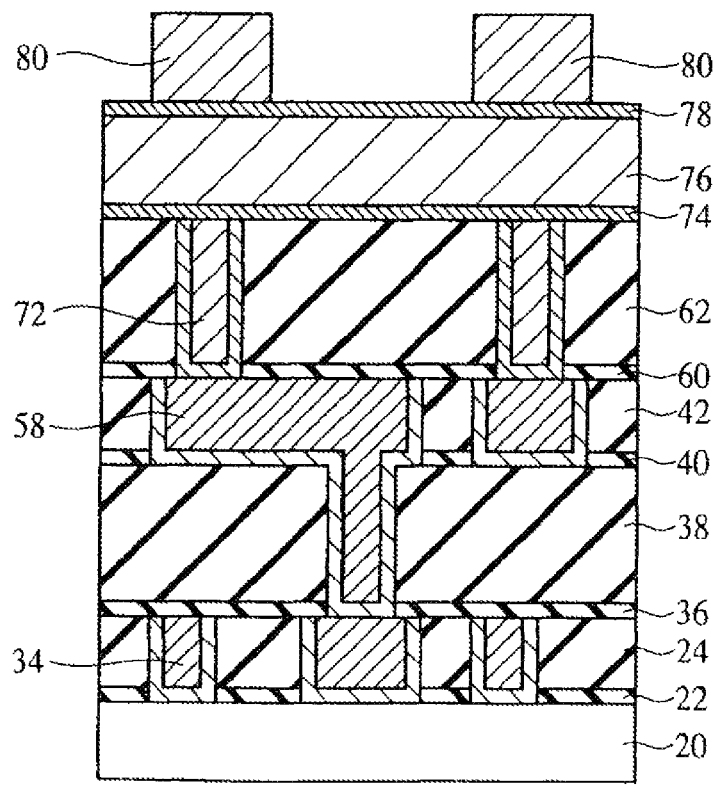

Then, the photoresist film 80 having a pattern for the interconnection to be formed is formed on the titanium nitride film 78 by photolithography (FIG. 13B).

Next, with the photoresist film 80 as a mask, the titanium nitride film 78, the aluminum film 76 and the titanium nitride film 74 are anisotropically etched to form the interconnections 82 connected to the interconnections 58 via the contact plugs 72 and having the layer structure of the titanium nitride film 78/the aluminum film 76/the titanium nitride film 74.

Then, the photoresist film 80 is removed by asking using, e.g., oxygen plasma.

Next, a 700 nm-thick silicon oxide film 84 and a 500 nm-thick silicon nitride film 86 are sequentially deposited by, e.g., CVD to form the cover film of the layer structure of the silicon nitride film 86/the silicon oxide film 86.

Thus, the semiconductor device shown in FIGS. 4A to 6 can be fabricated.

As described above, according to the present embodiment, a pattern is designed so that a design width of the groove-shaped via-hole is smaller than a design diameter of the hole-shaped via-hole, whereby even when a size difference takes place between the finished sizes of the hole-shaped pattern and the groove-shaped pattern, the defective filling of the contact plug and the interconnection can be prevented.

The defective filling of the contact plug can be prevented, whereby resultantly the cracking of the inter-layer insulating film can be prevented. Steps on the contact plug can be reduced, so that the step cannot be influential on the upper interconnection layers and insulating layers. Accordingly, defective contact with the upper interconnection layer and the problems taking place in laying the films can be hindered.

In the above-described embodiment, a width of the groove-shaped via-hole is generally decreased, but only a pattern width near the corner of the groove-shaped via-hole, where the defective filling occurs, may be selectively decreased.

[A Second Embodiment]

The semiconductor device and the method for fabricating the same according to a second embodiment of the present invention will be explained with reference to FIGS. 15 and 16. The same members of the present embodiment as those of the semiconductor device and the method for fabricating the same according to the first embodiment are represented by the same reference numbers not to repeat or to simplify their explanation.

Figure 15:
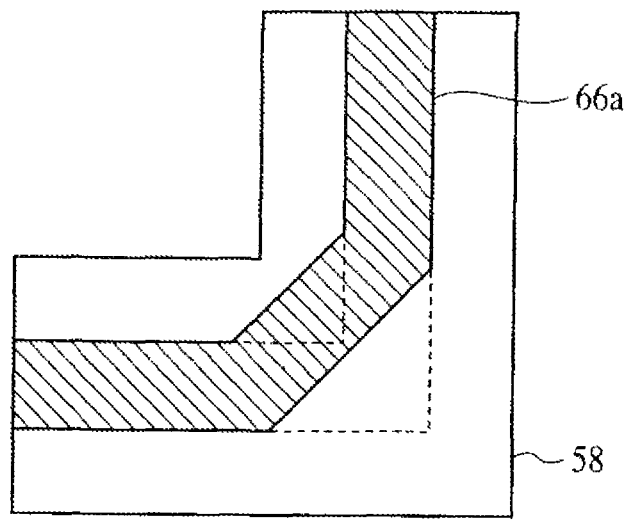
FIG. 15 is a plan view of a design structure of the semiconductor device according to a second embodiment of the present invention, which shows the structure thereof.

FIG. 15 is a plan view of a design structure of the semiconductor device according to the present embodiment. FIG. 16 is a plan view of a design structure of the semiconductor device according to a modification of the present embodiment.

The semiconductor device and the method for fabricating the same according to the present embodiment is the same as the semiconductor device and the method for fabricating the same according to the first embodiment except that a plane design of a groove-shaped via-hole in a groove-shaped via pattern forming region is different from that of the first embodiment.

In the semiconductor device according to the present embodiment, as shown in FIG. 15, the pattern of the groove-shaped via-hole 66a has the corner bent twice each time at 135°, whereby the corner is bent totally at 90°. The pattern of the via-hole 66a is thus designed, whereby a maximum width of the via-hole 66a can be made smaller in comparison with a maximum width the via-hole 66a is bent once by 90°. Thus, the generation of the defective filling of the contact plug 72a at the corner can be suppressed.

In using the pattern of the present embodiment, when two corners are too close to each other, the proximity effect of the exposure brings about the same result that is brought about when the via-hole 66a is bent by 90°. Accordingly, it is necessary to arrange two corners spaced from each other by some micrometers. The proximity effect varies depending on a pattern size and exposure conditions. It is preferable that a distance between the two corners is set in consideration of these points.

The pattern layout shown in FIG. 15 may be applied to the via-hole 46a. The application can suppress the defective filling of the interconnection 58.

As described above, according to the present embodiment, angle by which the groove-shaped via-hole is bent can be small, whereby even when a difference is generated between a finished size of the hole-shaped pattern and that of the groove-shaped patter, the defective filling of the contact plug and the interconnection can be precluded.

The defective filling of the contact plug is prevented, and as a result, the cracking of the inter-layer insulating film can be prevented. Steps on the contact plug can be reduced, so that the step cannot be influential on the upper interconnection layers and insulating layers. Accordingly, defective contact with the interconnection layer formed above, and the problems taking place in laying the films can be hindered.

Figure 16:
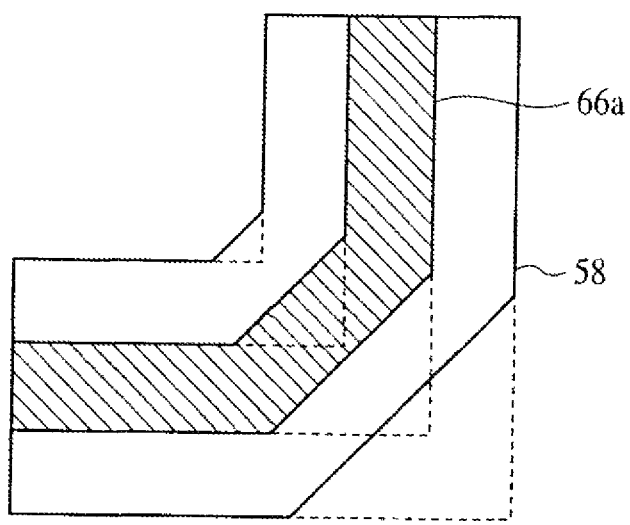
FIG. 16 is a plan view of a design structure of the semiconductor device according to a modification of the second embodiment of the present invention, which shows the structure thereof.

In the above-described embodiment, only the patter of the via-hole 66a is bent twice, but as shown in FIG. 16, the pattern of the interconnection 58 as well may be bent twice.

In the above-described embodiment, the pattern of the via-hole is bent twice. However, the pattern of the via-hole may be bent three or more times. In the semiconductor device according to the present embodiment, an angle by which the corner is bent once is made small, whereby a size difference between a width of the straight portions and a width of the bent portion are made small, whereby the defective filling is reduced. As long as a pattern can attain this object, an angle and times of bending can be any. The via pattern may be drawn in a curve of a curvature.

In the above-described embodiment, a design diameter of the hole-shaped via-hole and a design width of the groove-shaped via-hole are substantially equal to each other. In the same way as in the semiconductor device according to the first embodiment, a pattern may be designed so that a design diameter of the hole-shaped via-hole is smaller than a design width of the groove-shaped via-hole. Thus, the generation of the defective filling of the contact plug can further suppressed.

[A Third Embodiment]

The semiconductor device and the method for fabricating the same according to a third embodiment of the present invention will be explained with reference to FIG. 17. The same members of the present embodiment as those of the semiconductor device and the method for fabricating the same according to the first and the second embodiments shown in FIGS. 4A-16 are represented by the same reference numbers not to repeat or to simplify their explanation.

Figure 17:
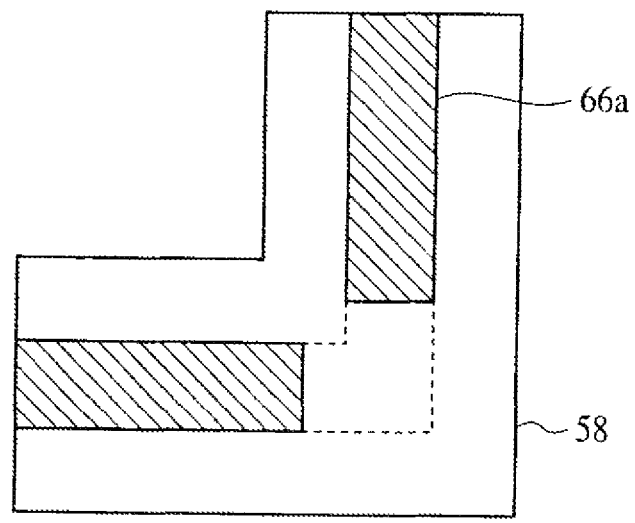
FIG. 17 is a plan view of a design structure of the semiconductor device according to a third embodiment of the present invention, which shows the structure thereof.

FIG. 17 is a plan view of the design structure of the semiconductor device according to the present embodiment.

The semiconductor device and the method for fabricating the same according to the present embodiment is the same as the semiconductor device and the method for fabricating the same according to the first and the second embodiments except that the plane design of a groove-shaped via-hole in a groove-shaped via pattern forming region is different from that of the latter.

In the semiconductor device according to the present embodiment, as shown in FIG. 17, the corner of the pattern of a via-hole 66a is removed to form the via-hole 66a of the straight patterns alone. That is, as viewed from the side of an interconnection 58, the pattern of the via-hole 66a is interrupted at the corner of the interconnection 58. In using a contact plug 72a filled in the via-hole 66a as a circuit device, such as an inductor, the removal of the corner of the pattern is a cause for increase of the interconnection resistance. However, no design demerit is caused by the removal of the pattern corner, when a resistance change due to the pattern change is sufficiently small.

The pattern of the via-hole 66a is thus designed, whereby a maximum width of the finished via-hole 66a can be small. Thus, the generation of the defective filling of the contact plug 72a can be suppressed.

The layout shown in FIG. 17 is applicable to a via-hole 46a. Thus the generation of the defective filling of the interconnection 58 can be suppressed.

As described above, according to the present embodiment, the corner of the groove-shaped pattern forming a via-hole is removed, whereby even when a difference is generated between a finished via-hole size of the hole-shaped patterns and a finished via-hole size of the groove-shaped pattern, the defective filling of the contact plug and the interconnection can be suppressed.

The defective filling of the contact plug is prevented, and resultantly, the cracking of the inter-layer insulating film can be prevented. Steps on the contact plug can be reduced, so that the step cannot be influential on the upper interconnection layers and insulating layers. Accordingly, defective contact with the interconnection layer formed above, and the problems taking place in laying the films can be hindered.

In the present embodiment, a design diameter of the hole-shaped via-hole and a design width of the groove-shaped via-hole are made substantially equal to each other. However, in the same way as in the semiconductor device according to the first embodiment, a pattern may be designed so that a design diameter of the hole-shaped via-hole is smaller than a design width of the groove-shaped via-hole. Thus, the generation of the defective filling of the contact plug can further suppressed.

[A Fourth Embodiment]

The semiconductor device and the method for fabricating the same according to a fourth embodiment of the present invention will be explained with reference to FIG. 18. The same members of the present embodiment as those of the semiconductor device and the method for fabricating the same according to the first to the third embodiments shown in FIGS. 4A to 17 are represented by the same reference numbers not to repeat or to simplify their explanation.

Figure 18:
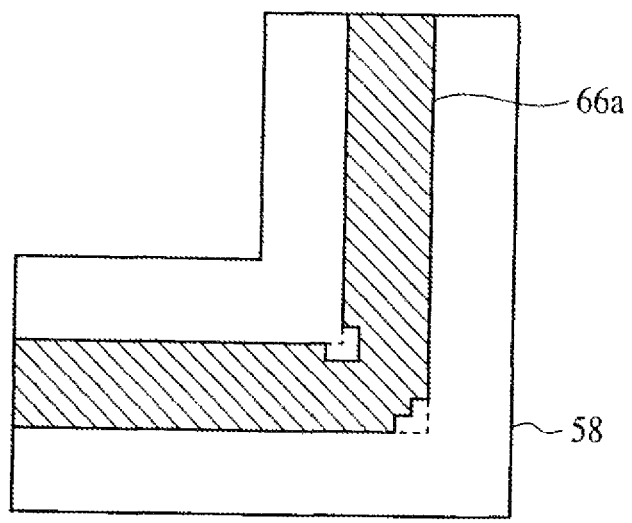
FIG. 18 is a plan view of a design structure of the semiconductor device according to a fourth embodiment of the present invention, which shows the structure thereof.

FIG. 18 is a plan view of the semiconductor device according to the present embodiment, which shows the structure thereof.

The semiconductor device and the method for fabricating the same according to the present embodiment is the same as the semiconductor device and the method for fabricating the same according to the first to the third embodiments except that the plane design of a groove-shaped via-hole in a groove-shaped via pattern forming region is different from that of the latter.

In the semiconductor device according to the present embodiment, as shown in FIG. 18, the pattern of the via-hole 66a is designed so that the exposure amount is restricted at the corner of the pattern. In the design shown in FIG. 18, the corner of the pattern of the via-hole 66a is cut off. The pattern of the via-hole 66a is thus designed, whereby increase of a width at the corner of the via-hole 66a can be suppressed. Accordingly, the generation of the defective filling of a contact plug 72a at the corner can be suppressed.

The layout of the via-hole shown in FIG. 18 may be applied to the via-hole 46a, whereby the generation of the defective filling of the interconnection 58 can be suppressed.

As described above, according to the present embodiment, the pattern of the corner is designed so that the exposure amount at the corner is restricted, whereby even when a difference is generated in the finished size between the hole-shaped pattern and the groove-shaped pattern, the generation of the defective filling of the contact plug and the interconnection can be suppressed.

The defective filling of the contact plug is prevented, and resultantly, the cracking of the inter-layer insulating film can be prevented. Steps on the contact plug can be reduced, so that the step cannot be influential on the upper interconnection layers and insulating layers. Accordingly, defective contact with the interconnection layer formed above, and the problems taking place in laying the films can be hindered.

In the present embodiment, the groove-shaped pattern is designed to have the corner cut off. However, as long as the exposure amount of the corner can be restricted, the groove-shaped pattern is not limited to the pattern shown in FIG. 18.

In the present embodiment, a design diameter of the hole-shaped via-hole and a design width of the groove-shaped via-hole are substantially equal to each other. However, in the same way as in the semiconductor device according to the first embodiment, a pattern may be designed so that a design diameter of the hole-shaped via-hole is smaller than a design width of the groove-shaped via-hole. Thus, the generation of the defective filling of the contact plug can be further suppressed.

[A Fifth Embodiment]

The semiconductor device and the method for fabricating the same according to a fifth embodiment of the present invention will be explained with reference to FIGS. 19 and 20. The same members of the present embodiment as those of the semiconductor device and the method for fabricating the same according to the first to the fourth embodiments shown in FIGS. 4A to 18 are represented by the same reference numbers not to repeat or to simplify their explanation.

Figure 19:
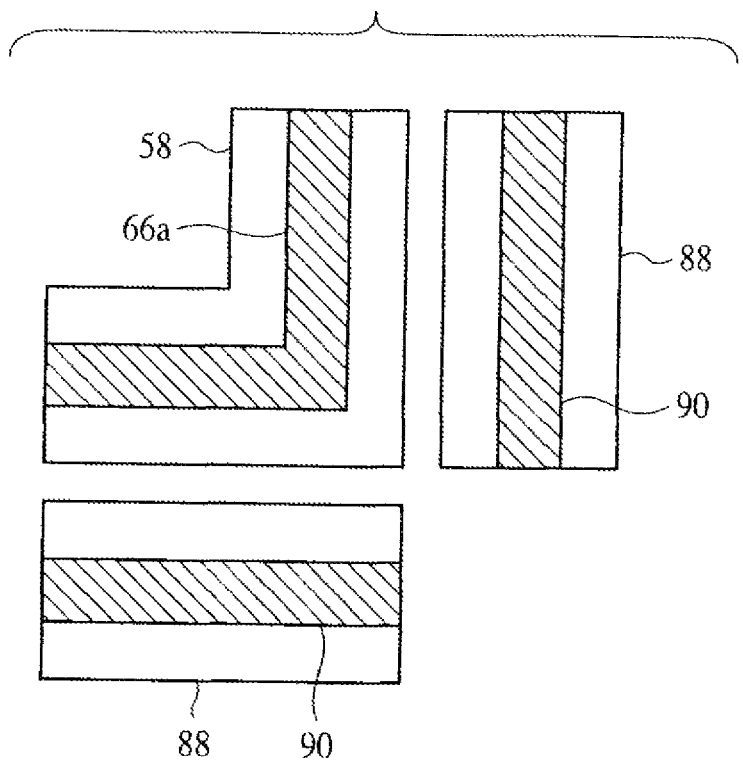
FIG. 19 is a plan view of the semiconductor device according to a fifth embodiment of the present invention, which shows the structure thereof.

FIG. 19 is a plan view of the semiconductor device according to the present embodiment, which shows the structure thereof. FIG. 20 is a plan view of the semiconductor device according to one modification of the present embodiment, which shows the structure thereof.

The semiconductor device and the method for fabricating the same according to the present embodiment is the same as the semiconductor device and the method for fabricating the same according to the first to the fourth embodiments except that a plane design of a groove-shaped via-hole in a groove-shaped via pattern forming region is different from that of the latter.

In the semiconductor device according to the present embodiment, as shown in FIG. 19, sub-patterns 88, 90 are arranged along the outer boundary of the groove-shaped via pattern. The sub-pattern 88 is an interconnection pattern formed of the same layer as the interconnection 58, and the sub-pattern 90 is a groove-shaped via pattern formed simultaneously with the formation of the pattern of the via-hole 66a.

In the case that the groove-shaped contact plugs are disposed adjacent to each other, when the defective filling of the contact plug occurs, inter-layer insulating film 62 cracks at the corner of the outermost boundary. With the groove-shaped pattern (the sub-pattern 90) is further provided outer of the via-hole 66a, no cracks are made in the inter-layer insulating film 62 at the corner of the inner via-hole 66a. In the case that the sub-pattern 90 has the pattern as exemplified in FIG. 19, which is free from the defective filling, no cracks are made in the inter-layer insulating film 62 at the corner of the sub-pattern 90.

The sub-pattern 90 is thus provided, whereby even when the defective filling takes place in the contact plug 72a filled in the via-hole 66a, the cracking of the inter-layer insulating film 62 can be prevented.

As described above, according to the present embodiment, the sub-pattern which prevents the cracking of the inter-layer insulating film is disposed adjacent to the groove-shaped via pattern, whereby even when the defective filling takes place in the groove-shaped via pattern, the cracking of the inter-layer insulating film can be prevented.

Figure 20:
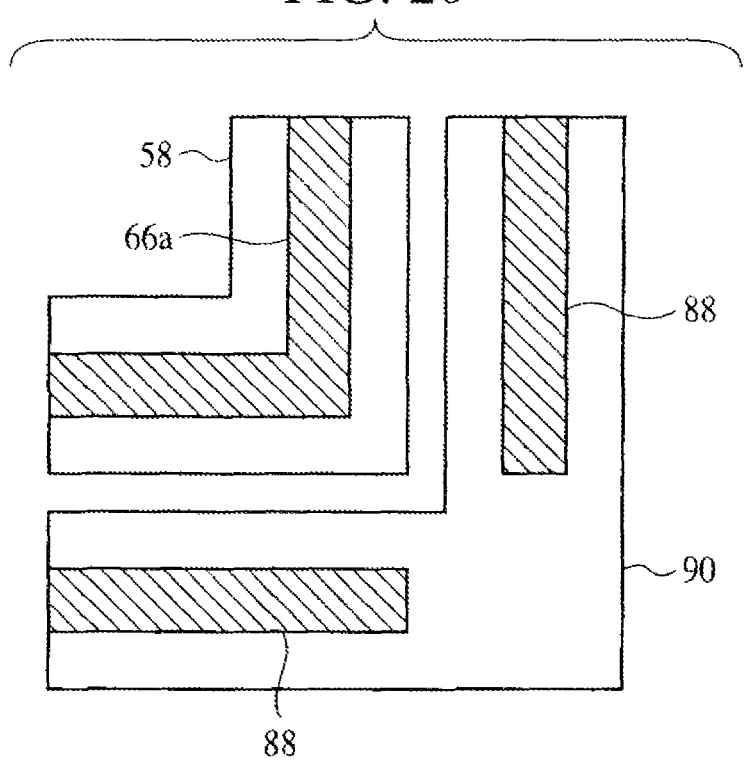
FIG. 20 is a plan view of the semiconductor device according to a modification of the fifth embodiment of the present invention, which shows the structure thereof.

In the present embodiment, the sub-patterns 88, 90 are respectively interrupted at the corner, but as shown in FIG. 20, the sub-pattern 88 may be not interrupted at the corner.

In the present embodiment, the sub-patterns are provided, whereby the cracking of the inter-layer insulating film 62 is prevented, but it is possible that the sub-patterns are provided, and the groove-shaped via-hole 66a has the pattern design which is the same as that of the semiconductor device according to the first to the fourth embodiments. Thus, the generation of the defective filling is suppressed, whereby the effect of preventing the cracking of the inter-layer insulating film can be enhanced.

[A Sixth Embodiment]

The semiconductor device and the method for fabricating the same according to a sixth embodiment of the present invention will be explained with reference to FIGS. 21 to 23. The same members of the present embodiment as those of the semiconductor device and the method for fabricating the same according to the first to the fifth embodiment shown in FIGS. 4A to 20 are represented by the same reference numbers not to repeat or to simplify their explanation.

Figure 21:
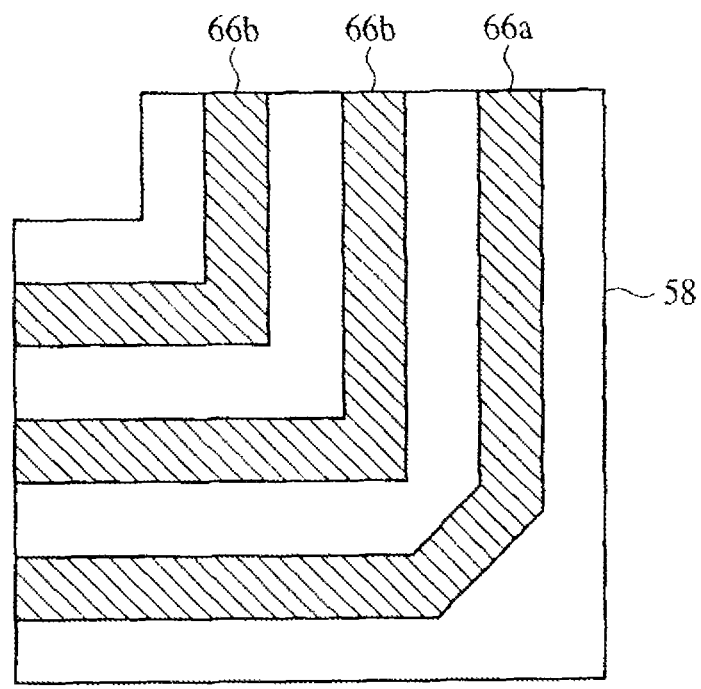
FIG. 21 is a plan view of the semiconductor device according to a sixth embodiment of the present invention, which shows the structure thereof.
Figure 22:
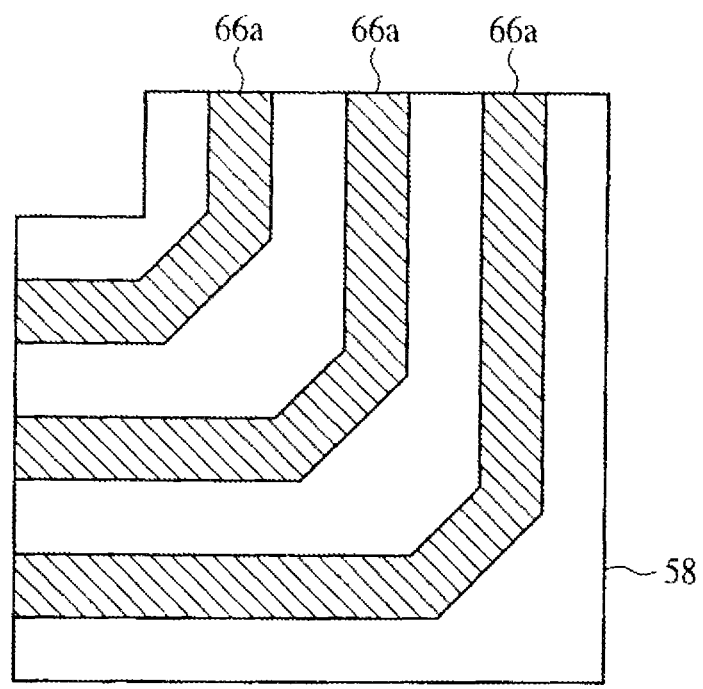
FIGS. 22 and 23 are plan views of the semiconductor devices according to modifications of the sixth embodiment of the present invention, which show the structure thereof.

FIG. 21 is a plan view of the semiconductor device according to the present embodiment, which shows the structure thereof. FIGS. 22 and 23 are plan views of the semiconductor device according to modifications of the present embodiment, which show the structures thereof.

As shown in FIG. 1A, in the device, such as an inductor, a plurality of groove-shaped via patterns are arranged on the interconnection 10 for lowering electric resistance etc. Then, in the present embodiment, plane design examples of groove-shaped via-holes for the case that a plurality of groove-shaped via patterns are arranged on one interconnection will be explained.

The semiconductor device and the method for fabricating the same according to the present embodiment is the same as the semiconductor device and the method for fabricating the same according to the first to the fourth embodiments except that the plane design of the groove-shaped via-hole in the groove-shaped via-hole pattern forming region is different from that of the latter.

In the semiconductor device according to the present embodiment, a pattern including a plurality of groove-shaped via patterns arranged adjacent to each other includes as the outermost groove-shaped via-hole pattern the pattern of the via-hole 66a of the semiconductor device according to the second embodiment shown in FIG. 15.

That is, as shown in FIG. 21, on a pattern of an interconnection 58, patterns of two via-holes 66b which are bent at 90° at the corner, and a pattern of a via-hole 66a which is bent twice each at 135° at the corner.

In the case where groove-shaped contact plugs are disposed adjacent to each other, when the defective filling of the contact plugs takes place, cracks are made in the inter-layer insulating film 62 at the corner of the outermost pattern. However, the via-hole 66a which is free from the defective filling is arranged at the outermost boundary, whereby even when the defective filling of the via-hole 66b takes place, the cracking of the inter-layer insulating film 62 can be prevented.

As described above, in the semiconductor device according to the present embodiment, having a pattern of a plurality of groove-shaped via patterns arranged adjacent to each other, the outermost groove-shaped via pattern is provided by the pattern of the second embodiment, whereby even when the defective filling takes place in an inner groove-shaped via pattern, the cracking of the inter-layer insulating film can be prevented.

In the present embodiment, the outermost groove-shaped via pattern alone is provided by the pattern of the second embodiment. However, as shown in FIG. 22, all the groove-shaped via patterns may be provided by the pattern of the second embodiment. Thus, the defective filling can be suppressed, and the cracking of the inner-layer insulating film can be more effectively prevented.

Figure 23:
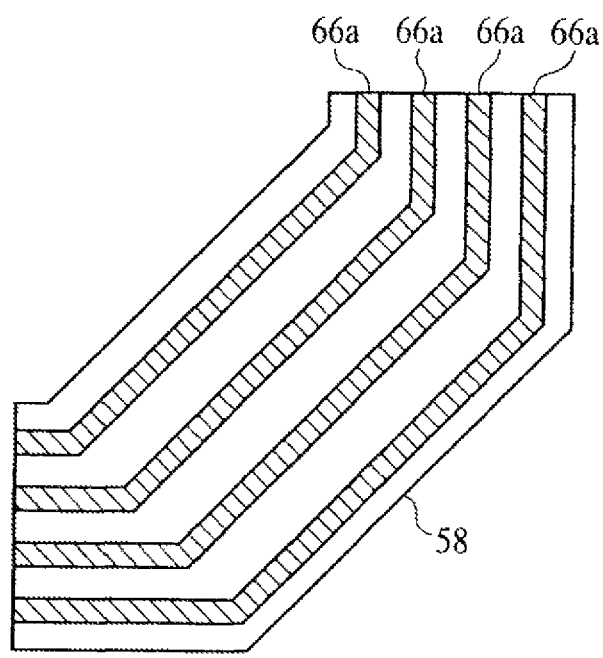

As shown in FIG. 23, in the same way as, e.g., in the modification of the second embodiment shown in FIG. 16, the patterns of the interconnection 58 may be bent as the pattern of the via-hole 66a.

[A Seventh Embodiment]

The semiconductor device and the method for fabricating the same according to a seventh embodiment of the present invention will be explained with reference to FIGS. 24 and 25. The same members of the present embodiment as those of the semiconductor device and the method for fabricating the same according to the first to the sixth embodiment shown in FIGS. 4A to 23 are represented by the same reference numbers not to repeat or to simplify their explanation.

Figure 24:
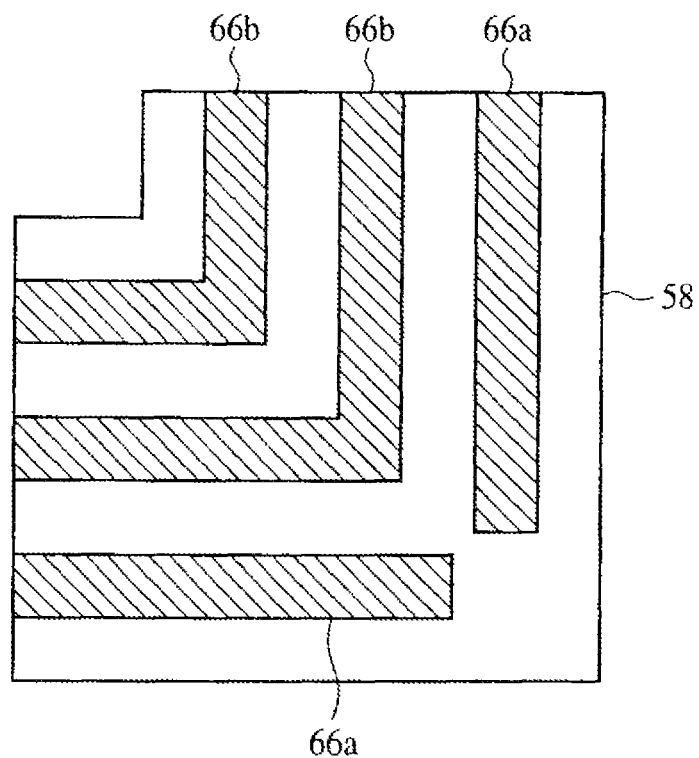
FIG. 24 is a plan view of the semiconductor device according to a seventh embodiment of the present invention, which shows the structure thereof.
Figure 25:
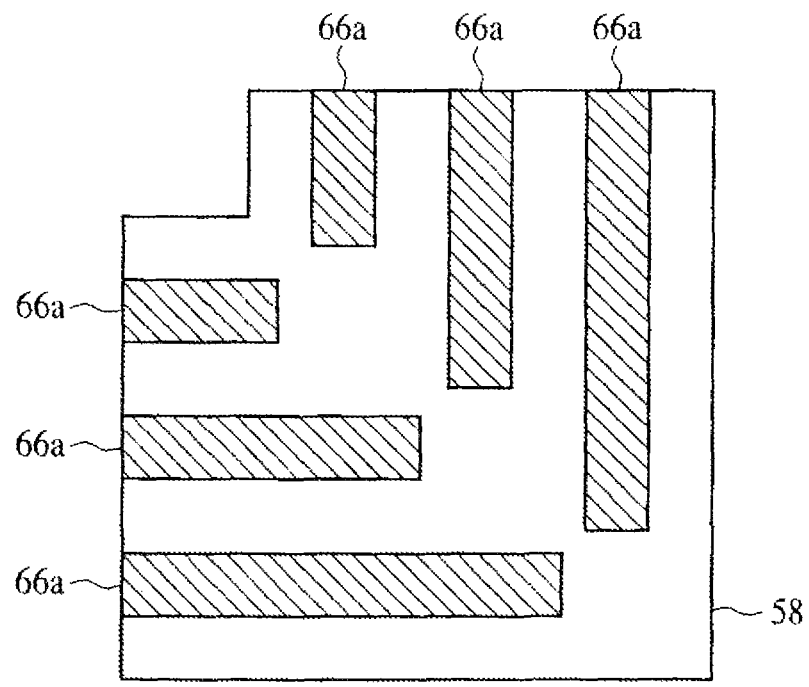
FIG. 25 is a plan view of the semiconductor device according to a modification of the seventh embodiment of the present invention, which shows the structure thereof.

FIG. 24 is a plan view of the semiconductor device according to the present embodiment, which shows the structure thereof. FIG. 25 is a plan view of the semiconductor device according to one modification of the present embodiment, which shows the structure thereof.

In the present embodiment, as in the sixth embodiment, plane design examples of groove-shaped via-holes for the case that a plurality of groove-shaped via patterns are arranged on one interconnection will be explained.

The semiconductor device and the method for fabricating the same according to the present embodiment is the same as the semiconductor device and the method for fabricating the same according to the first to the fourth embodiments except that the plane design of the groove-shaped via-hole in a groove-shaped via pattern forming region is different from that of the latter.

In the semiconductor device according to the present embodiment, a pattern including a plurality of groove-shaped via patters disposed adjacent to each other includes as the outermost groove-shaped via pattern the pattern of the via-hole 66a of the semiconductor device according to the third embodiment shown in FIG. 17.

That is, as shown in FIG. 24, on the pattern of an interconnection 58 patterns of two via-holes 66b which are bent at 90° at the corner, and a pattern of a via-hole 66a disposed at the outer boundary that the via pattern at the corner is removed.

In the case where the groove-shaped contact plugs are disposed adjacent to each other, when the defective filling of the contact plugs takes place, cracks are made in the inter-layer insulating film 62 at the corner of the outermost boundary. However, the via-hole 66a, which is free from the defective filling, is arranged at the outermost boundary, whereby even when the defective filling takes place in the via-hole 66b, the cracking of the inter-layer insulating film 62 can be prevented.

As described above, in the semiconductor device according to the present embodiment, including the pattern of a plurality of groove-shaped via patterns disposed adjacent to each other, the outermost groove-shaped via pattern is provided by the pattern of the third embodiment, whereby even when the defective filling of an inner groove-shaped via pattern, the cracking of the inter-layer insulating film can be prevented.

In the above-described embodiment, the outermost groove-shaped via pattern alone is provided by the pattern of the third embodiment. However, as shown in FIG. 25, all the groove-shaped via patterns may be provided by the patterns of the third embodiment. Thus, the generation of the defective filling can be further suppressed, whereby the cracking of the inter-layer insulating film can be effectively prevented.

[An Eight Embodiment]

The semiconductor device and the method for fabricating the same according to an eighth embodiment of the present invention will be explained with reference to FIGS. 26, 27A-27B, 28A-28B, 29A-29C, and 30A-30C. The same members of the present embodiment as those of the semiconductor device and the method for fabricating the same according to the first to the seventh embodiments shown in FIGS. 4A to 25 are represented by the same reference numbers not to repeat or to simplify their explanation.

Figure 26:
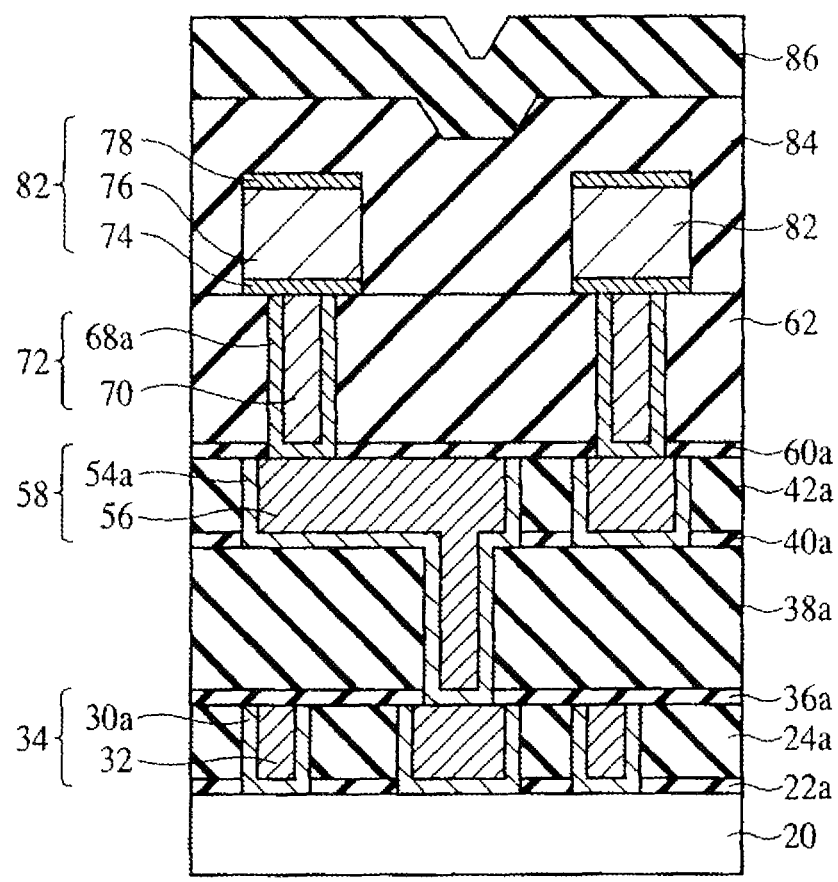
FIG. 26 is a diagrammatic sectional view of the semiconductor device according to an eighth embodiment of the present invention, which shows the structure thereof.
Figure 29A:
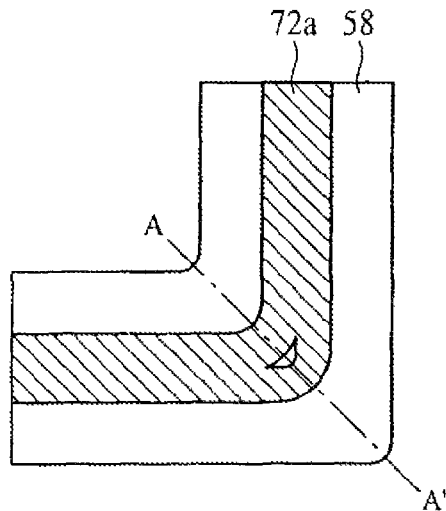
FIGS. 29A-29C are views explaining causes of the generation of the defective filling of the contact plug.
Figure 29B:
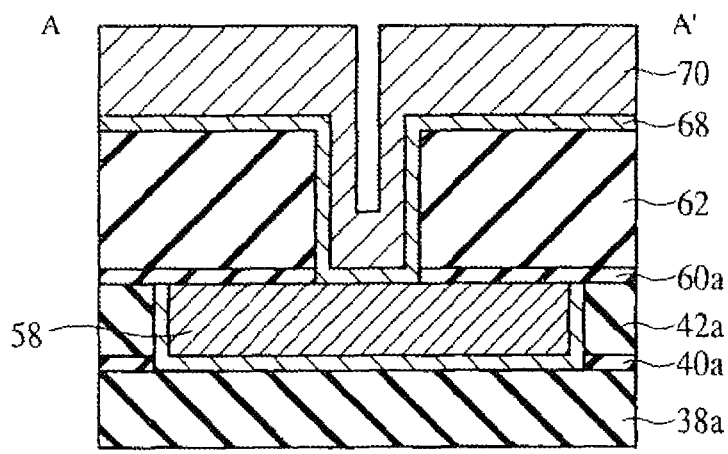
Figure 29C:
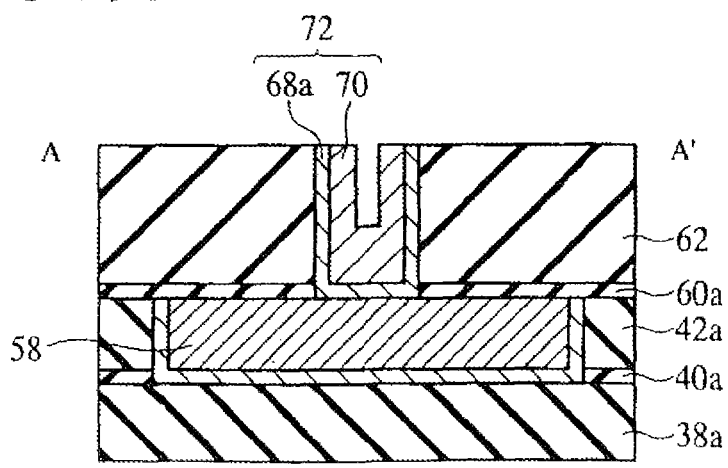
Figure 30A:
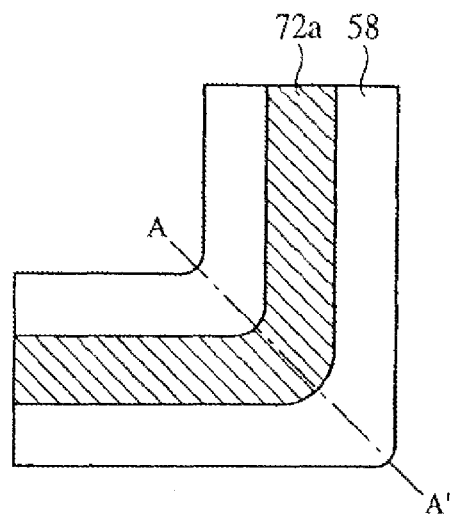
FIGS. 30A-30C are views explaining means for preventing the defective filling of the contact plug in the fabrication steps.
Figure 30B:
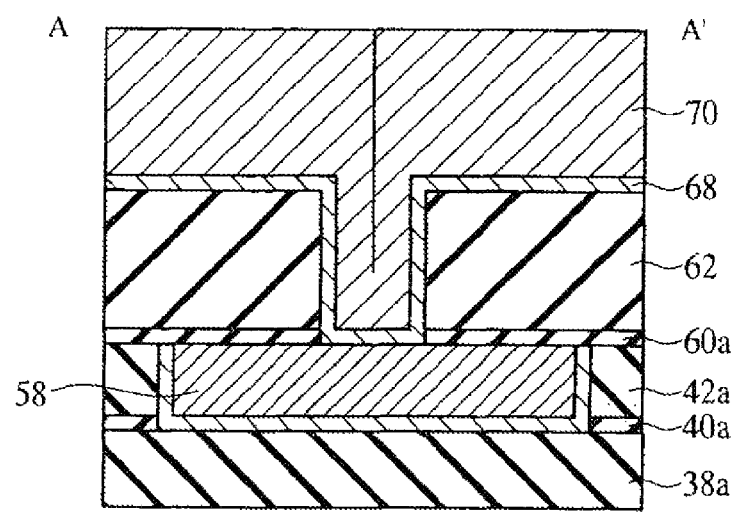
Figure 30C:
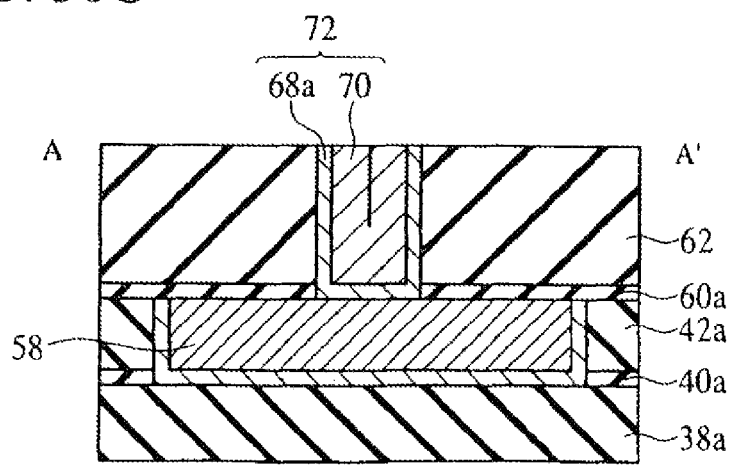

FIG. 26 is a diagrammatic sectional view of the semiconductor device according to the present embodiment, which shows the structure there of. FIGS. 27A-27B and 28A-28B are sectional views of the semiconductor device according to the present embodiment in the steps of the method for fabricating the same, which show the method. FIG. 29A-29C are views explaining a cause for the generation of the defective filling of contact plug. FIGS. 30A-30C are views explaining means in the fabrication steps of preventing the defective filling of the contact plug.

First, the structure of the semiconductor device according to the present embodiment will be explained with reference to FIG. 26.

As shown in FIG. 26, the semiconductor device according to the present embodiment is the same as the semiconductor device according to the first embodiment shown in FIG. 5 in the basic sectional structure. Differences of the semiconductor device according to the present embodiment from the semiconductor device according to the first embodiment are that etching stopper films 22a, 36a, 40a, 60a of an SiC film are used in place of the etching stopper films 22, 36, 40, 60 of a silicon nitride film, and inter-layer insulating films 24a, 38a, 42a of an SiOC film are used in place of the inter-layer insulating films 24, 38, 42 of a silicon oxide film.

The inventor of the present application has confirmed that the cracking is made in the inter-layer insulating film 62 due to the defective filling of the contact plug 72a in the SiOC film/SiC film-based inter-layer insulating film structure as well as the silicon oxide film/silicon nitride film-based inter-layer insulating film structure. The present invention is effective in the SiOC film/SiC film-based inter-layer insulating film structure.

In the semiconductor device according to the present embodiment, the patterns of the semiconductor device according to the first to the seventh embodiments are not used as the plane design of the via-hole 66a. As the groove-shaped via pattern, a pattern bent at 90° as exemplified in FIG. 1A may be used. This is for the prevention of the defective filling of the contact plugs 72a by a contrivance of the fabrication process which will be described later in the present embodiment.

Next, the method for fabricating the semiconductor device according to the present embodiment will be explained with reference to FIGS. 27A-27B, 28A-28B, 29A-29C, and 30A-30C.

Figure 27A:
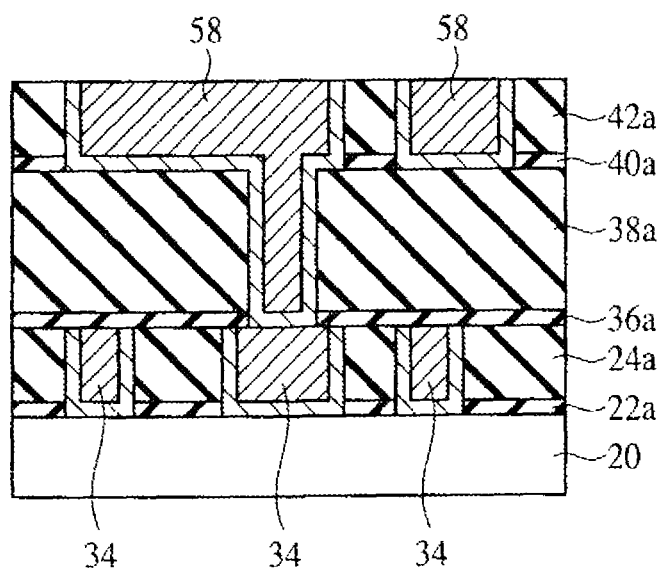
FIGS. 27A-27B and 28A-28B are sectional views of the semiconductor device according to the eighth embodiment of the present invention in the steps of the method for fabricating the same, which show the method.

First, in the same way as, e.g., in the method for fabricating the semiconductor device according to the first embodiment shown in FIGS. 7A to 11A, interconnections 34, 58, etc. are formed on a substrate 20. At this time, in the present embodiment, the etching stopper films 22a, 36a, 40a, 60a of an SiC film are formed in place of the etching stopper films 22, 36, 40, 60 of a silicon nitride film, and the inter-layer insulating films 24a, 38a, 42a of an SiOC film are formed in place of the inter-layer insulating films 24, 38, 42 of a silicon oxide film (FIG. 27A).

Figure 27B:
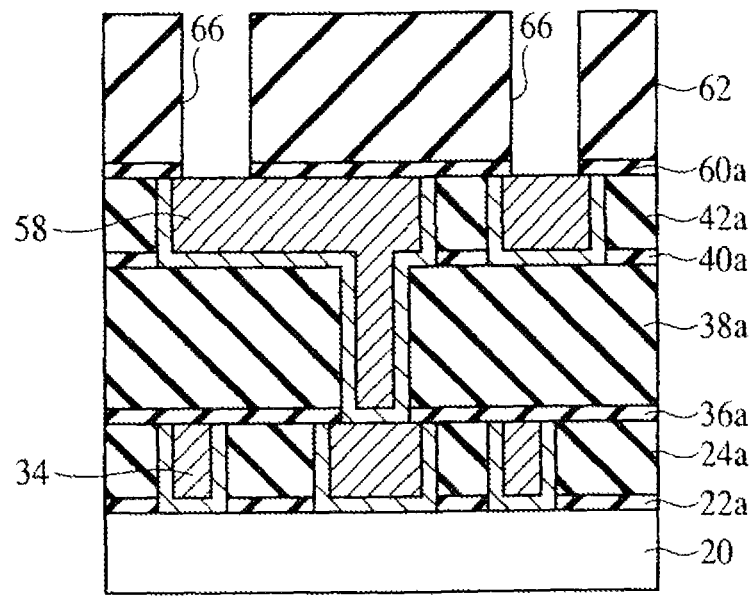

Next, in the same way as, e.g., in the method for fabricating the semiconductor device according to the first embodiment shown in FIG. 11B to 12A, the etching stopper film 60a of an SiC film and the inter-layer insulating film 62 are formed on the inter-layer insulating film 42a with the interconnections 58 buried in, and then the via-holes 66, 66a are formed in the inter-layer insulating film 62 and the etching stopper film 60a down to the interconnections 58 (FIG. 27B). In forming the via-holes, when a design diameter of the via-holes 66 in the inner circuit region is 0.5 μm, and a design width of the via-hole 66a in the groove-shaped via pattern forming region is 0.5 μm, as described above, in their finished sizes on a wafer, the diameter of the via-holes 66 is about 0.5 μm, and the width of the via-hole 66a is about 0.80 μm at maximum.

Figure 28A:
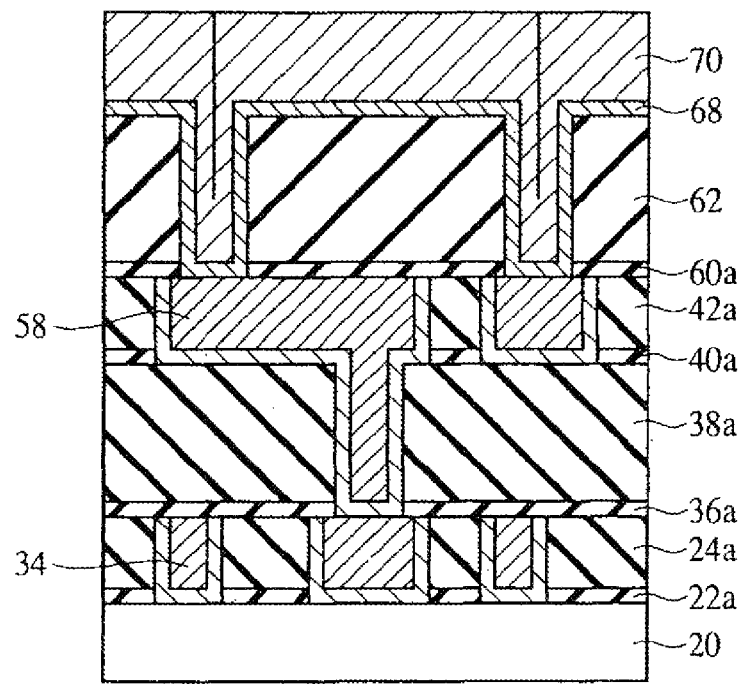

Next, a 50 nm-thick titanium nitride film 68 and a 400 nm-thick tungsten film 70 are formed sequentially by, e.g., sputtering and by, e.g., CVD (FIG. 28A).

Figure 28B:
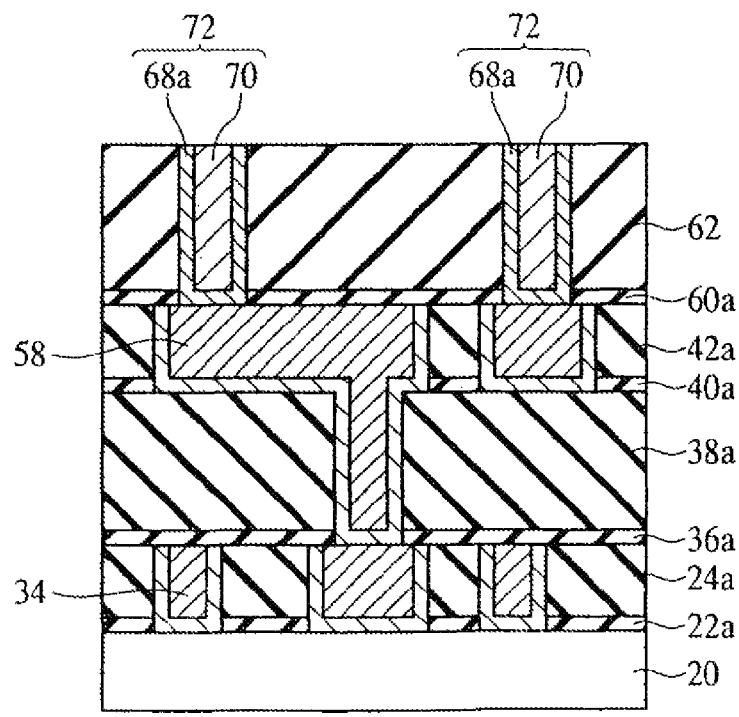

Next, the tungsten film 70 and the titanium nitride film 68 are planarly removed by, e.g., CMP until the inter-layer insulating film 62 is exposed. Thus, the contact plugs 72 which are filled in the via-holes 66 and which includes the barrier metal layer 68a formed of the titanium nitride film 68, and the tungsten film 70, and the contact plug 72a which is filled in the via-hole 66a and which includes the barrier metal layer 68a formed of the titanium nitride film 68, and the tungsten film 70 are formed (FIG. 28B).

In the first embodiment, film thickness conditions of the titanium nitride film 68 and the tungsten film 70 for forming the contact plugs 72 are respectively set to 50 nm and to 300 nm so as to sufficiently fill the via-holes 66. However, such film thickness conditions can completely fill the vial holes of a 0.7 µm-maximum width but cannot completely fill the via-hole 66a having a 0.8 µm-maximum width at the corner (FIG. 29B). Accordingly, when the contact plug 72a is formed later by polishing by CMP, the defective filling takes place at the central part of the plug (FIGS. 29A and 29C).

Then, in the present embodiment, film thickness conditions for filling the via-holes 66 are set in consideration of a maximum width of the via-hole 66a. When film thicknesses of the titanium nitride film 68 and the tungsten film for forming the contact plugs 72 are set to be respectively 50 nm and 400 nm as described above, the via-holes of a 0.9 µm-maximum width can be completely filled, and accordingly, the via-hole 66a having an about 0.8 µm-maximum width at the corner can be completely filled (FIG. 30B). Accordingly, even when the contact plug 72a is formed later by polishing by CMP, the defective filling does not take place (FIGS. 30A and 30C).

Figure 14:
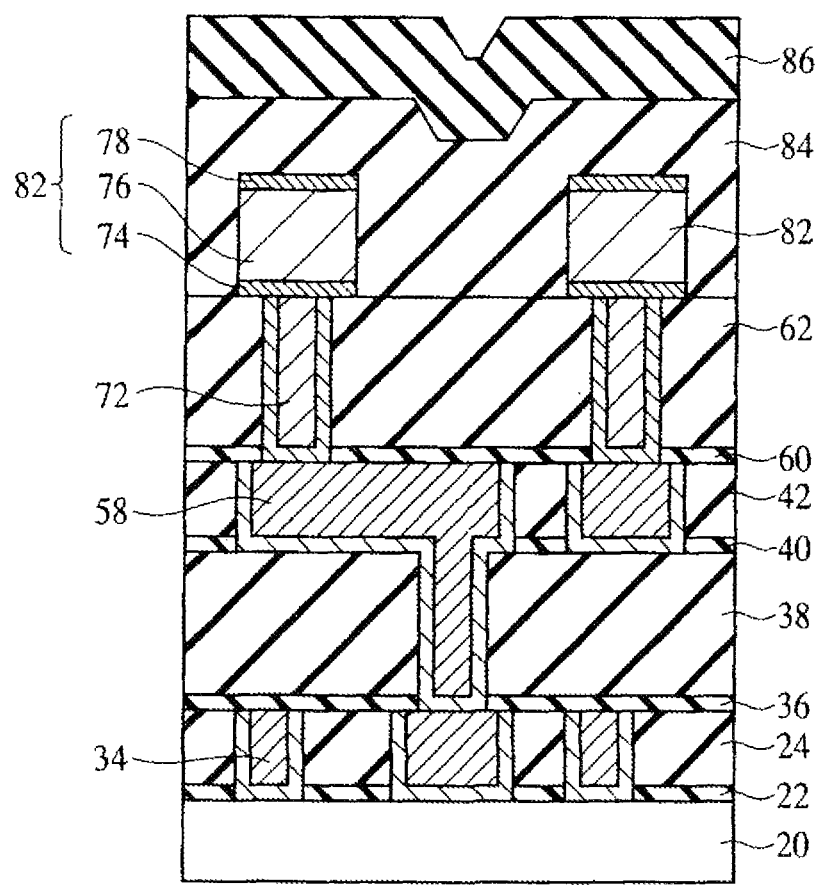

Then, in the same way as, e.g., in the method for fabricating the semiconductor device according to the first embodiment shown in FIGS. 13B to 14, the interconnections 82, a cover film, etc. are formed on the inter-layer insulating film 62 with the contact plugs 72, 72a buried in.

As described above, according to the present embodiment, film thickness conditions for forming the contact plugs are set in consideration of a maximum width of the groove-shaped via pattern, whereby even when a difference takes place in the finished size between the hole-shaped pattern and the groove-shaped pattern, the defective filling of the contact plug and the interconnection can be prevented. The cracking of the inter-layer insulating film due to the defective filling can be prevented.

In the present embodiment, as the inter-layer insulating film structure around the copper interconnection, the SiOC film/SiC film-based insulating film is used, but the silicon oxide film/silicon nitride film-based inter-layer insulating film structure may be used as in the semiconductor device according to the first embodiment.

In the present embodiment, the plane design of the via-hole 66a is not contrived, but the via-hole 66a may use the patterns of the semiconductor device according to the first to the seventh embodiments. Thus, the generation of the defective filling can be more effectively prevented both in the design and the process.

[A Ninth Embodiment]

The semiconductor device according to a ninth embodiment of the present invention will be explained with reference to FIGS. 31 and 32.

Figure 31:
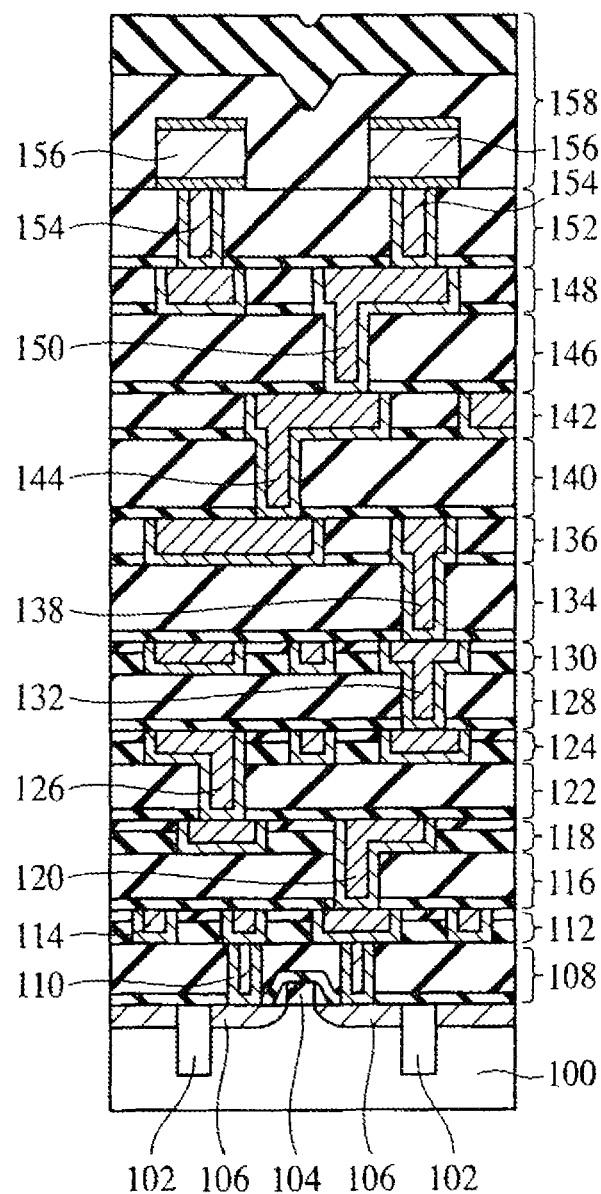
FIG. 31 is a diagrammatic sectional view of the semiconductor device according to a ninth embodiment of the present invention, which shows the structure thereof.

FIG. 31 is a diagrammatic sectional view of the semiconductor device according to the present embodiment, which shows the structure thereof. FIG. 32 is a diagrammatic sectional view of the semiconductor device according to another example of the present embodiment, which shows the structure thereof.

In the present embodiment, a specific structure of the semiconductor device which includes copper interconnections and aluminum interconnections will be explained. In the above-described first to the third embodiments, the interconnection layers are three, but the semiconductor device according to the present embodiment includes three or more interconnection layers.

The semiconductor device shown in FIG. 31 has the multi-level interconnection layer structure including seven copper interconnection layers and one aluminum interconnection layer.

A device isolation film 102 for defining device regions is formed on a silicon substrate 100. A MOS transistor including a gate electrode 104 and source/drain diffused layers 106 is formed in the device region defined by the device isolation film 102.

An inter-layer insulating film 108 of a layer film of a PSG film/a silicon nitride film is formed on the silicon substrate 100 with the MOS transistor formed on. Contact plugs 110 of a layer structure of a tungsten film/a titanium nitride film are buried in the inter-layer insulating film 108.

An inter-layer insulating film 112 of a layer structure of a silicon oxide film/a SiLK (registered trademark) film (or an SOG film) is formed on the inter-layer insulating film 108 with the contact plugs 110 buried in. Interconnections 114 of a layer structure of a copper film/a tantalum film are buried in the inter-layer insulating film 112.

An inter-layer insulating film 116 of a layer film of a silicon oxide film/a silicon nitride film is formed on the inter-layer insulating film 112 with the interconnections 114 buried in. An inter-layer insulating film 118 of a layer film of a silicon oxide film/a SiLK film (or an SOG film) is formed on the inter-layer insulating film 116. Interconnections 120 of a layer structure of a copper film/a tantalum film are formed in the inter-layer insulating films 116, 118 with the via portion buried in the inter-layer insulating film 116 and the interconnection portion buried in the inter-layer insulating film 118.

An inter-layer insulating film 122 of a layer film of a silicon oxide film/a silicon nitride film is formed on the inter-layer insulating film 118 with the interconnections 120 buried in. An inter-layer insulating film 124 of a layer film of a silicon oxide film/a SiLK film (or an SOG film) is formed on the inter-layer insulating film 122. Interconnections 126 of a layer structure of a copper film/a tantalum film are formed in the inter-layer insulating films 122, 124 with the via portion buried in the inter-layer insulating film 122 and the interconnection portion buried in the inter-layer insulating film 124.

An inter-layer insulating film 128 of a layer film of a silicon oxide film/a silicon nitride film is formed on the inter-layer insulating film 124 with the interconnections 126 buried in. An inter-layer insulating film 130 of a layer film of a silicon oxide film/a SiLK film (or an SOG film) is formed on the inter-layer insulating film 128. Interconnections 132 of a layer structure of a copper film/a tantalum film are formed in the inter-layer insulating films 128, 130 with the via portion buried in the inter-layer insulating film 128 and the interconnection portion buried in the inter-layer insulating film 130.

An inter-layer insulating film 134 of a layer film of a silicon oxide film/a silicon nitride film is formed on the inter-layer insulating film 130 with the interconnections 132 buried in. An inter-layer insulating film 136 of a layer film of a silicon oxide film/a silicon nitride film is formed on the inter-layer insulating film 134. Interconnections 138 of a layer structure of a copper film/a tantalum film are formed in the inter-layer insulating films 134, 136 with the via portion buried in the inter-layer insulating film 134 and the interconnection portion buried in the inter-layer insulating film 136.

An inter-layer insulating film 140 of a layer film of a silicon oxide film/a silicon nitride film is formed on the inter-layer insulating film 136 with the interconnections 138 buried in.

An inter-layer insulating film 142 of a layer film of a silicon oxide film/a silicon nitride film is formed on the inter-layer insulating film 140. Interconnections 144 of a layer structure of a copper film/a tantalum film are formed in the inter-layer insulating films 140, 142 with the via portion buried in the inter-layer insulating film 140 and the interconnection portion buried in the inter-layer insulating film 142.

An inter-layer insulating film 146 of a layer film of a silicon oxide film/a silicon nitride film is formed on the inter-layer insulating film 142 with the interconnections 144 buried in. An inter-layer insulating film 148 of a layer film of a silicon oxide film/a silicon nitride film is formed on the inter-layer insulating film 146. Interconnections 150 of a layer structure of a copper film/a tantalum film are formed in the inter-layer insulating films 146, 148 with the via portion buried in the inter-layer insulating film 146 and the interconnection portion buried in the inter-layer insulating film 148.

An inter-layer insulating film 152 of a layer film of a silicon oxide film/a silicon nitride film is formed on the inter-layer insulating film 148 with the interconnections 150 buried in. Contact plugs 154 of a layer structure of a tungsten film/a titanium nitride film are buried in the inter-layer insulating film 152.

Interconnections 156 of a layer film of a titanium nitride film/an aluminum film/a titanium nitride film are formed on the inter-layer insulating film 152 with the contact plugs 154 buried in.

A cover film 158 of a layer film of a silicon nitride film/a silicon oxide film is formed on the inter-layer insulating film 152 with the interconnections 156 formed on.

Thus, the semiconductor device having the multi-level interconnection structure including seven copper interconnection layers and one aluminum interconnection layer is formed.

In the semiconductor device shown in FIG. 31, the present invention may be applicable to the step of forming the contact plugs 154. Accordingly, the defective filling of the contact plugs 154 can be prevented, and resultantly the cracking of the inter-layer insulating film 152 can be prevented. In the case that the defective filling of the copper interconnections takes place, the present invention may be applicable to the steps of forming the interconnections 120, 126, 132, 138, 144, 150. In the case that groove-shaped vias are used for the contact plugs 110, the defective filling of the contact plugs 110 can be also prevented.

Figure 32:
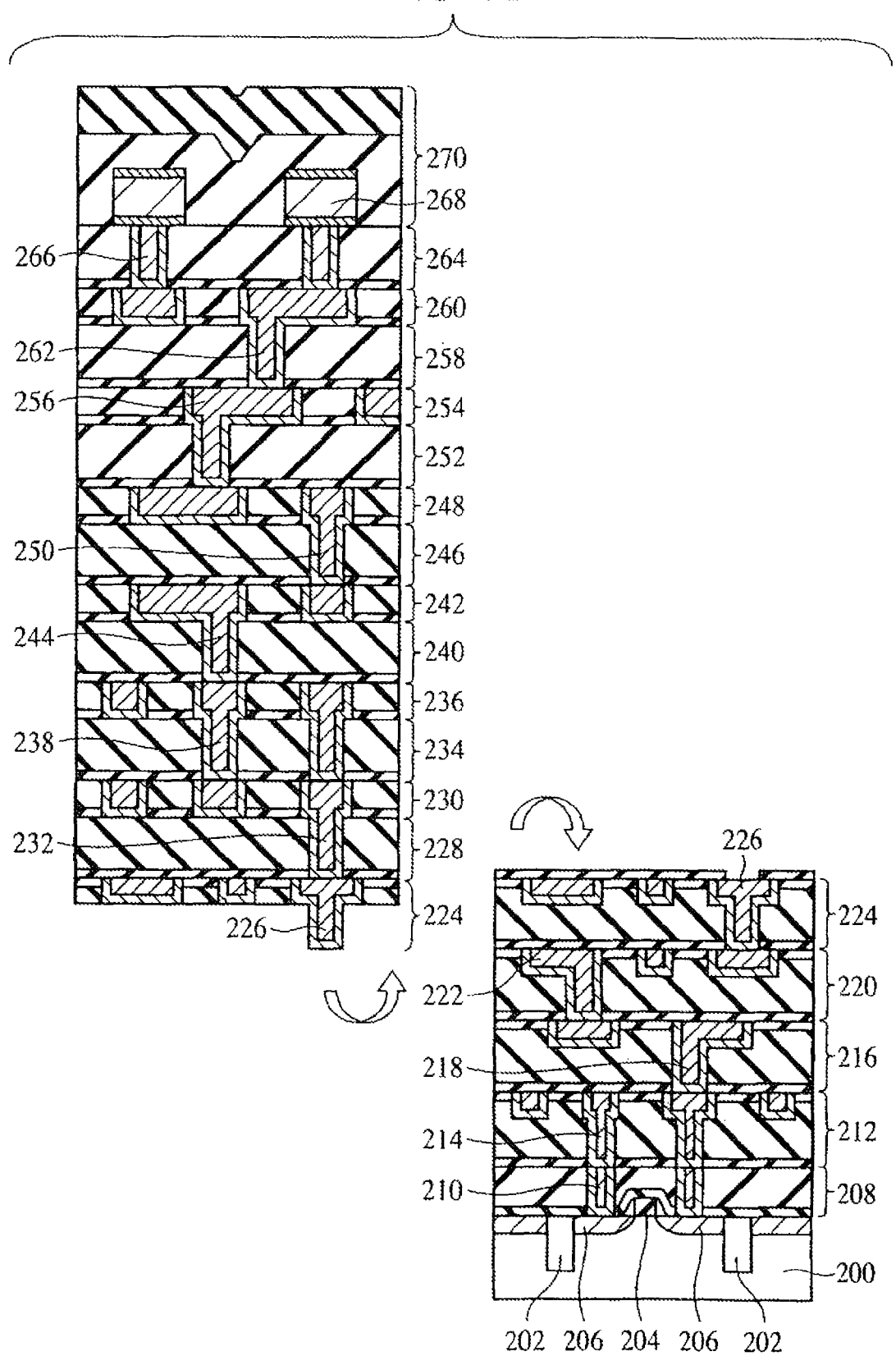
FIG. 32 is a diagrammatic sectional view of the semiconductor device according to another example of the ninth embodiment of the present invention, which shows the structure thereof.

In the semiconductor device shown in FIG. 32, a multi-level interconnection layer structure is formed of ten copper interconnection layers and one aluminum interconnection layer.

A device isolation film 202 for defining device regions is formed on a silicon substrate 200. In the device region defined by the device isolation film 202, a MOS transistor including a gate electrode 204 and source/drain diffused layers 206 is formed.

On the silicon substrate 200 with the MOS transistor formed on, an inter-layer insulating film 208 of a layer film of a PSG film/a silicon nitride film is formed. Contact plugs 210 of a layer structure of a tungsten film/a titanium nitride film are buried in the inter-layer insulating film 208.

An inter-layer insulating film 212 of a layer film of an SiC film/a SiLK film/an SiC film is formed on the inter-layer insulating film 208 with the contact plugs 210 buried in. Interconnections 214 of a layer structure of a copper film/a tantalum film and having the via portion and the interconnection portion are buried in the inter-layer insulating film 212.

An inter-layer insulating film 216 of a layer film of an SiC film/a SiLK film/an SiC film is formed on the inter-layer insulating film 212 with the interconnections 214 buried in. Interconnections 218 of a layer structure of a copper film/a tantalum film and having the via portion and the interconnection portion are buried in the inter-layer insulating film 216.

An inter-layer insulating film 220 of a layer film of an SiC film/a SiLK film/an SiC film is formed on the inter-layer insulating film 216 with the interconnections 218 buried in. Interconnections 222 of a layer structure of a copper film/a tantalum film and having the via portion and the interconnection portion are buried in the inter-layer insulating film 220.

An inter-layer insulating film 224 of a layer film of an SiC film/a SiLK film/an SiC film is formed on the inter-layer insulating film 220 with the interconnections 222 buried in. Interconnections 226 of a layer structure of a copper film/a tantalum film and having the via portion and the interconnection portion are buried in the inter-layer insulating film 224.

An inter-layer insulating film 228 of a layer film of an SiOC film/an SiC film is formed on the inter-layer insulating film 224 with the interconnections 226 buried in. An inter-layer insulating film 230 of an SiOC film/an SiC film is formed on the inter-layer insulating film 228. Interconnections 232 of a layer structure of a copper film/a tantalum film are formed in the inter-layer insulating films 228, 230 with the via portion buried in the inter-layer insulating film 228 and the interconnection portion buried in the inter-layer insulating film 230.

An inter-layer insulating film 234 of a layer structure of an SiOC film/an SiC film is formed on the inter-layer insulating film 230 with the interconnections 232 buried in. An inter-layer insulating film 236 of a layer structure of an SiOC film/an SiC film is formed on the inter-layer insulating film 234. Interconnections 238 of a layer structure of a copper film/a tantalum film are formed in the inter-layer insulating films 234, 236 with the via portion buried in the inter-layer insulating film 234 and the interconnection portion buried in the inter-layer insulating film 236.

An inter-layer insulating film 240 of a layer film of an SiOC film/an SiC film is formed on the inter-layer insulating film 236 with the interconnections 238 buried in. An inter-layer insulating film 242 of a layer film of an SiOC film/an SiC film is formed on the inter-layer insulating film 240. Interconnections 244 of a layer structure of a copper film/a tantalum film are formed in the inter-layer insulating films 240, 242 with the via portion buried in the inter-layer insulating film 240 and the interconnection portion buried in the inter-layer insulating film 242.

An inter-layer insulating film 246 of a layer film of an SiOC film/an SiC film is formed on the inter-layer insulating film 242 with the interconnections 244 buried in. An inter-layer insulating film 248 of a layer film of an SiOC film/an SiC film is formed on the inter-layer insulating film 246. Interconnections 250 of a layer structure of a copper film/tantalum film are formed in the inter-layer insulating films 246, 248 with the via portion buried in the inter-layer insulating film 246 and the interconnection portion buried in the inter-layer insulating film 248.

An inter-layer insulating film 252 of a layer film of a silicon oxide film/an SiC film is formed on the inter-layer insulating film 248 with the interconnections 250 buried in. An inter-layer insulating film 254 of a layer film of a silicon oxide film/an SiC film is formed on the inter-layer insulating film. Interconnection 256 of a layer structure of a copper film/a tantalum film are formed in the inter-layer insulating films 252, 254 with the via portion buried in the inter-layer insulating film 252 and the interconnection portion buried in the inter-layer insulating film 254.

An inter-layer insulating film 258 of a layer film of a silicon oxide film/an SiC film is formed on the inter-layer insulating film 254 with the interconnections 256 buried in. An inter-layer insulating film 260 of a layer film of a silicon oxide film/an SiC film is formed on the inter-layer insulating film 258. Interconnections 262 of a layer structure of a copper film/a tantalum film are formed in the inter-layer insulating films 258, 260 with the via portion buried in the inter-layer insulating film 258 and the interconnection portion buried in the inter-layer insulating film 260.

An inter-layer insulating film 264 of a layer film of a silicon oxide film/an SiC film is formed on the inter-layer insulating film 260 with the interconnections 262 buried in. Contact plugs 266 of a layer structure of a tungsten film/a titanium nitride film are buried in the inter-layer insulating film 264.

Interconnections 268 of a layer film of a titanium nitride film/an aluminum film/titanium nitride film is formed on the inter-layer insulating film 264 with the contact plugs 266 buried in.

A cover film 270 of a layer film of a silicon nitride film/a silicon oxide film is formed on the inter-layer insulating film with the interconnection 268 formed on.

Thus, the semiconductor device including the multi-level interconnection layer structure including ten copper interconnection layers and one aluminum interconnection layer is formed.

In the semiconductor device shown in FIG. 32, the present invention may be applicable to the step of forming the contact plugs 266. Accordingly, the defective filling of the contact plugs 266 can be prevented, and accordingly the cracking of the inter-layer insulating film 264 can be prevented. In the case the copper interconnection has the defective filling, the present invention may be applicable to the step of forming the interconnections, 214, 218, 222, 226, 232, 238, 244, 250, 256. In the case that the contact plugs 210 are buried in groove-shaped vias, the defective filling of the contact plugs 210 can be also prevented.

[Modified Embodiments]

The present invention is not limited to the above-described embodiments and can cover other various modifications.

For example, in the above-described embodiments, structures the groove-shaped via patterns are used in are inductors. However, structures the groove-shaped via patterns are used in are not limited to inductors.

Figure 33A:
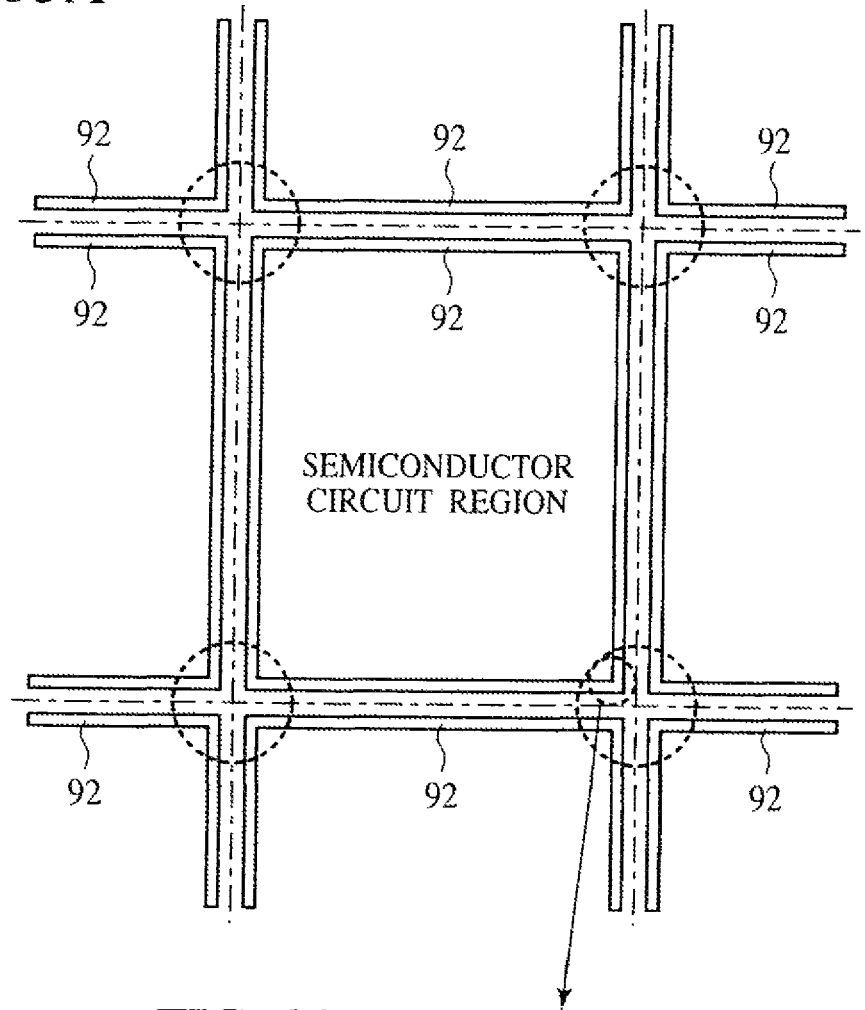
FIGS. 33A and 33B are plan views of the semiconductor device according to a first modified embodiment of the present invention, which show the structure thereof.
Figure 33B:
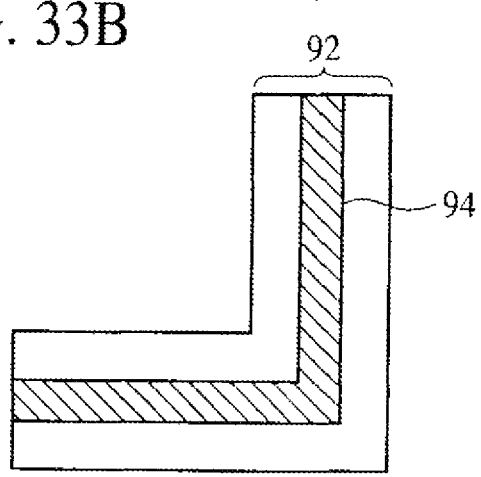
Figure 34A:
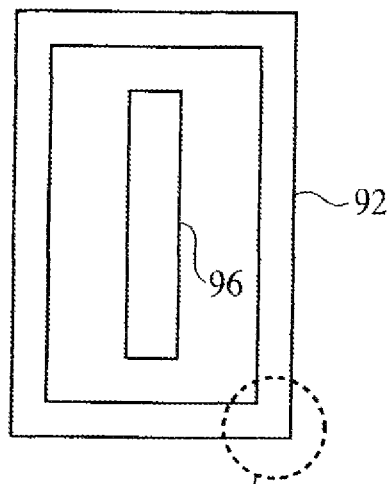
FIGS. 34A and 34B are plan views of the semiconductor device according to a second modified embodiment of the present invention, which show the structure thereof.
Figure 34B:
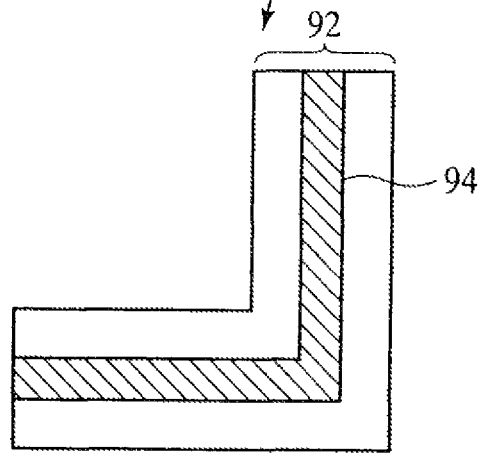
Figure 35A:
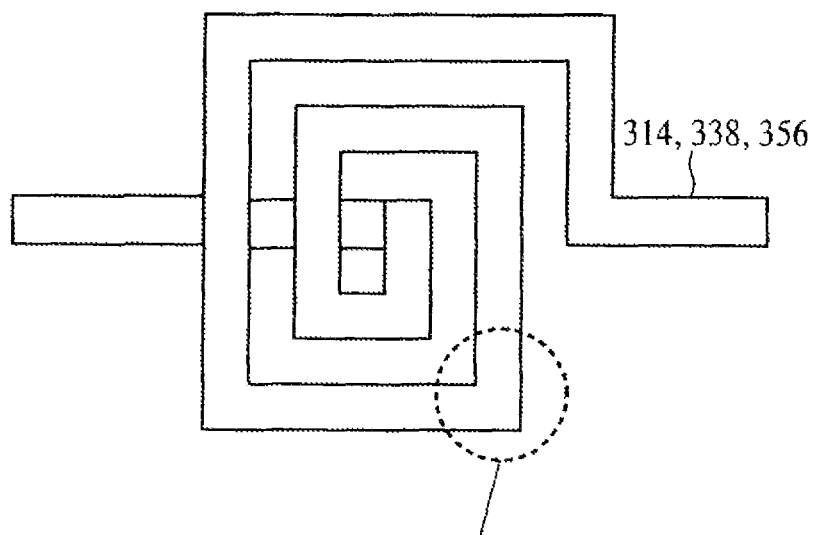
FIGS. 35A and 35B are plan views of the conventional semiconductor device having the inductor, which show the structure thereof.
Figure 35B:
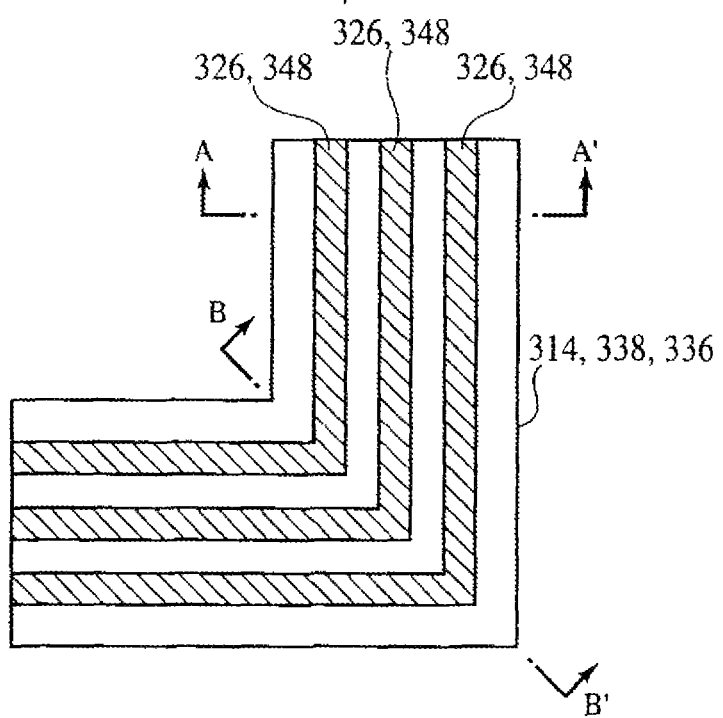
Figure 36:
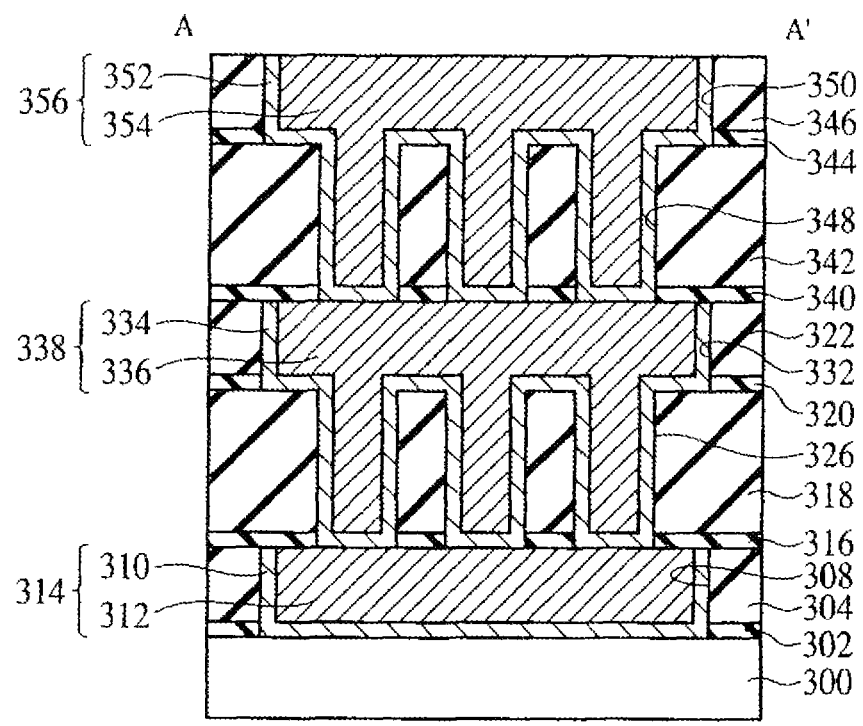
FIG. 36 is a diagrammatic sectional view of the conventional semiconductor device having the inductor, which shows the structure thereof.
Figure 37:
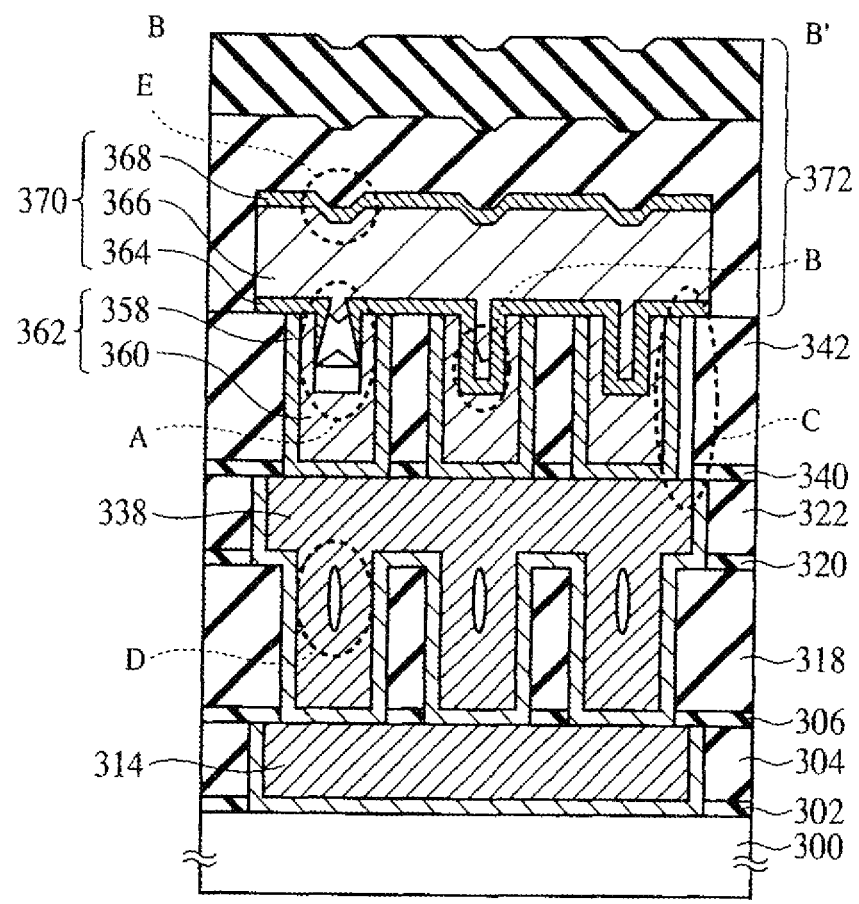
FIG. 37 is a diagrammatic sectional view showing a new structure according to an idea of the inventor of the present application, and problems thereof.
Figure 38:
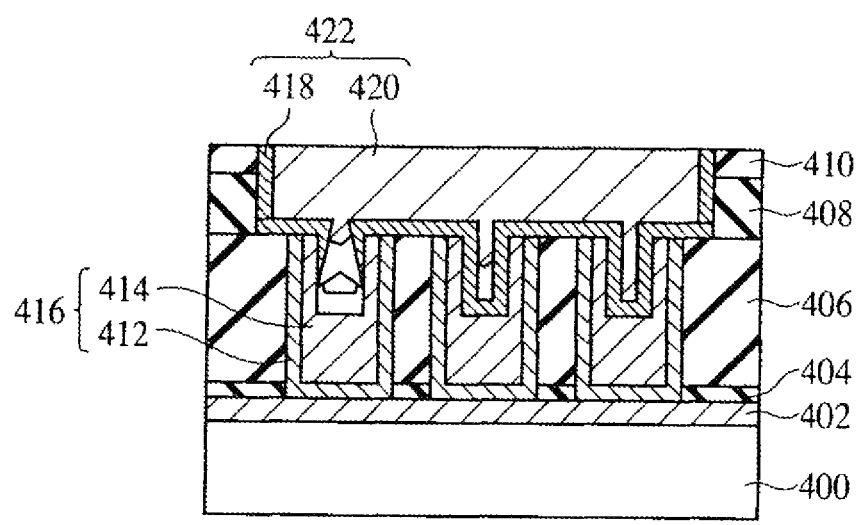
FIG. 38 is a diagrammatic sectional view showing the problems of the conventional semiconductor device.

In forming a plurality of semiconductor devices on a wafer, as shown in FIG. 33A, each semiconductor circuit region is surrounded by a guard ring 92 for protecting the device from water, etc. from the environments. As shown in FIG. 33B, this guard ring 92 is formed by using the groove-shaped via pattern 94. As shown in FIG. 34A, the guard ring 92 is provided around a fuse pattern 96 of a redundant circuit. As shown in 34B, this guard ring 92 is also formed by using the groove-shaped via pattern 94. Accordingly, the structure according to the present invention is used in the corners of these guard rings, whereby the cracking of the inter-layer insulating films of the guard rings at the corners can be prevented, whereby the semiconductor device can have improved water resistance.

In the above-described embodiments, the uppermost interconnection layer alone is formed of aluminum interconnection layer, but two or more aluminum interconnection layers may be used. The present invention is widely applicable to semiconductor devices having the structure that tungsten plugs are used as a connection between a copper interconnection layer and an aluminum interconnection layer. The interconnection layer structure and the insulating film structure applicable to the present invention are not limited to the structures described in the above-described embodiments.

For the prevention of the defective filling, the present invention may be applicable to the contact plugs on a substrate, and disadvantages in forming upper interconnection layers can be prevented.

In the above-described sixth and seventh embodiments, the pattern examples used in a plurality of groove-shaped via patterns arranged adjacent to each other are explained by means of the patterns of the second embodiment and the third embodiment. However, the pattern of the first embodiment or the pattern of the fourth embodiment may be used in forming a plurality of groove-shaped via patterns. In arranging a plurality of groove-shaped via patterns, the sub-patterns of the fifth embodiment may be provided at the outer boundary.

What is claimed is:

1. A semiconductor device comprising:
a rectangular semiconductor substrate including a semiconductor circuit region and four corners;
a first insulating film formed above the rectangular semiconductor substrate;
a first conductor formed in the first insulating film;
a second insulating film formed above the first insulating film;
a plurality of guard rings that surround the semiconductor circuit region; and
an additional guard ring that surrounds the semiconductor region,
wherein each of the guard rings is comprised of a first groove-shaped via-hole formed in the second insulating film;
the additional guard ring is comprised of a second groove-shaped via-hole formed in the second insulating film;
each of the first groove-shaped via-holes includes a pattern bent twice each time at an angle of larger than 90° at each of the four corners;
each of the guard rings is coupled to the first conductor;
the pattern is bent in total at 90° at each of the four corners of the rectangular semiconductor substrate;
each of the first groove-shaped via-holes is filled with a second conductor that is electrically coupled to the substrate, and
the second groove-shaped via-hole is filled with a third conductor formed in the second groove-shaped via-hole and electrically coupled to the substrate.

2. The semiconductor device of claim 1, wherein the pattern is bent twice each time at an angle of approximately 135° at each of the four corners.

3. The semiconductor device of claim 1, wherein the plurality of guard rings consists of two guard rings.

4. The semiconductor device of claim 1, wherein the plurality of guard rings consists of three guard rings.

5. The semiconductor device of claim 1, wherein the second conductor includes copper.

6. The semiconductor device of claim 1, wherein
the second conductor includes a first metal film,
the first metal film includes copper,
the second conductor includes a second metal film,
the second metal film include tantalum, and
the second metal film is located between the first metal film and the second insulating film.

7. The semiconductor device of claim 1, wherein the first insulating film includes silicon, oxygen and carbon.

8. The semiconductor device of claim 1, wherein the second insulating film includes silicon, oxygen and carbon.

9. The semiconductor device of claim 6, wherein the first insulating film includes silicon and oxygen.

10. The semiconductor device of claim 1, wherein
the first conductor surrounds the semiconductor circuit region,
the first conductor is bent twice each time at an angle of larger than 90° at each of the four corners, and
the first conductor is bent in total at 90° at each of the four corners of the rectangular semiconductor substrate.

11. The semiconductor device of claim 10, wherein the first conductor is bent twice each time at an angle of approximately 135° at each of the four corners.

12. The semiconductor device of claim 10, wherein the plurality of guard rings consists of two guard rings.

13. The semiconductor device of claim 10, wherein the plurality of guard rings consists of three guard rings.

14. The semiconductor device of claim 1, wherein the second conductor is a part of dual damascene structure, and
the third conductor is a part of dual damascene structure.

15. The semiconductor device of claim 1, wherein the first conductor is a part of dual damascene structure.

* * * * *